United States Patent
Jeon et al.

(10) Patent No.: US 10,141,312 B2
(45) Date of Patent: Nov. 27, 2018

(54) SEMICONDUCTOR DEVICES INCLUDING INSULATING MATERIALS IN FINS

(71) Applicant: Samsung Electronics Co., Ltd., Suwon-si (KR)

(72) Inventors: Ho-Jin Jeon, Yongin-si (KR); Young-Gun Ko, Seongnam-si (KR); Gi-Gwan Park, Suwon-si (KR); Je-Min Yoo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/296,703

(22) Filed: Oct. 18, 2016

(65) Prior Publication Data
US 2017/0110456 A1 Apr. 20, 2017

Related U.S. Application Data

(60) Provisional application No. 62/243,757, filed on Oct. 20, 2015.

(30) Foreign Application Priority Data

Dec. 11, 2015 (KR) .......................... 10-2015-0177286

(51) Int. Cl.
| | |
|---|---|
| H01L 27/092 | (2006.01) |
| H01L 29/06 | (2006.01) |
| H01L 27/02 | (2006.01) |
| H01L 29/78 | (2006.01) |
| H01L 29/08 | (2006.01) |
| H01L 29/165 | (2006.01) |
| H01L 27/088 | (2006.01) |
| H01L 21/8234 | (2006.01) |
| H01L 21/8238 | (2006.01) |

(52) U.S. Cl.
CPC .. *H01L 27/0924* (2013.01); *H01L 21/823431* (2013.01); *H01L 21/823481* (2013.01); *H01L 21/823821* (2013.01); *H01L 21/823878* (2013.01); *H01L 27/0207* (2013.01); *H01L 27/0886* (2013.01); *H01L 29/0653* (2013.01); *H01L 29/0847* (2013.01); *H01L 29/165* (2013.01); *H01L 29/7846* (2013.01); *H01L 29/7848* (2013.01); H01L 21/823412 (2013.01); H01L 21/823807 (2013.01)

(58) Field of Classification Search
CPC ......................... H01L 27/0924; H01L 27/0207
USPC ......................................................... 257/190
See application file for complete search history.

(56) References Cited

U.S. PATENT DOCUMENTS 8,765,546 B1 * 7/2014 Hung .............. H01L 21/823431
257/190
9,299,700 B2 3/2016 Park et al.
(Continued)

FOREIGN PATENT DOCUMENTS

KR 10-2016-0102788 A 8/2016

*Primary Examiner* — Moazzam Hossain
*Assistant Examiner* — Warren H Kilpatrick
(74) *Attorney, Agent, or Firm* — Myers Bigel, P.A.

(57) ABSTRACT

Semiconductor devices are provided. A semiconductor device includes a first insulating material in a first fin. The semiconductor device includes a second insulating material in a second fin. The first and second insulating materials have different respective sizes. For example, in some embodiments, the first and second insulating materials have different respective widths and/or depths in the first and second fins, respectively.

18 Claims, 41 Drawing Sheets

(56) References Cited

U.S. PATENT DOCUMENTS

| | | | |
|---|---|---|---|
| 2012/0280291 A1* | 11/2012 | Lee | H01L 21/28123 257/288 |
| 2014/0151810 A1* | 6/2014 | Maeda | H01L 29/41791 257/365 |
| 2015/0214341 A1 | 7/2015 | Shin et al. | |
| 2016/0043170 A1 | 2/2016 | Park et al. | |
| 2016/0079125 A1 | 3/2016 | Kim et al. | |
| 2016/0268414 A1 | 9/2016 | Park et al. | |
| 2017/0005102 A1* | 1/2017 | Feng | H01L 27/1104 |

* cited by examiner

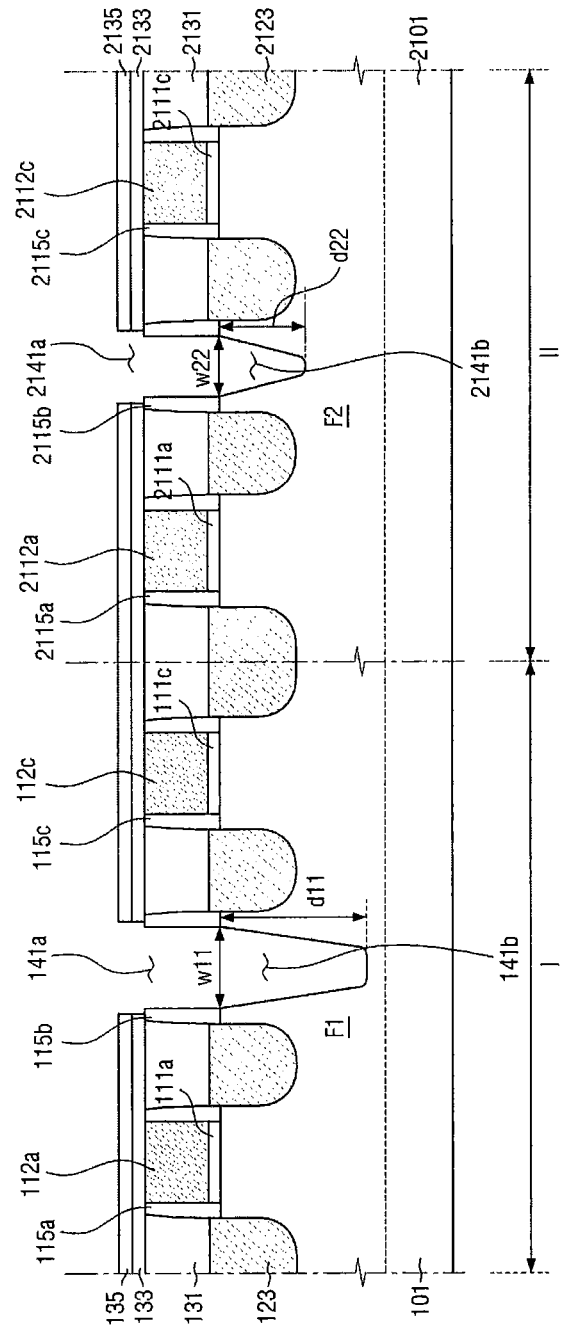

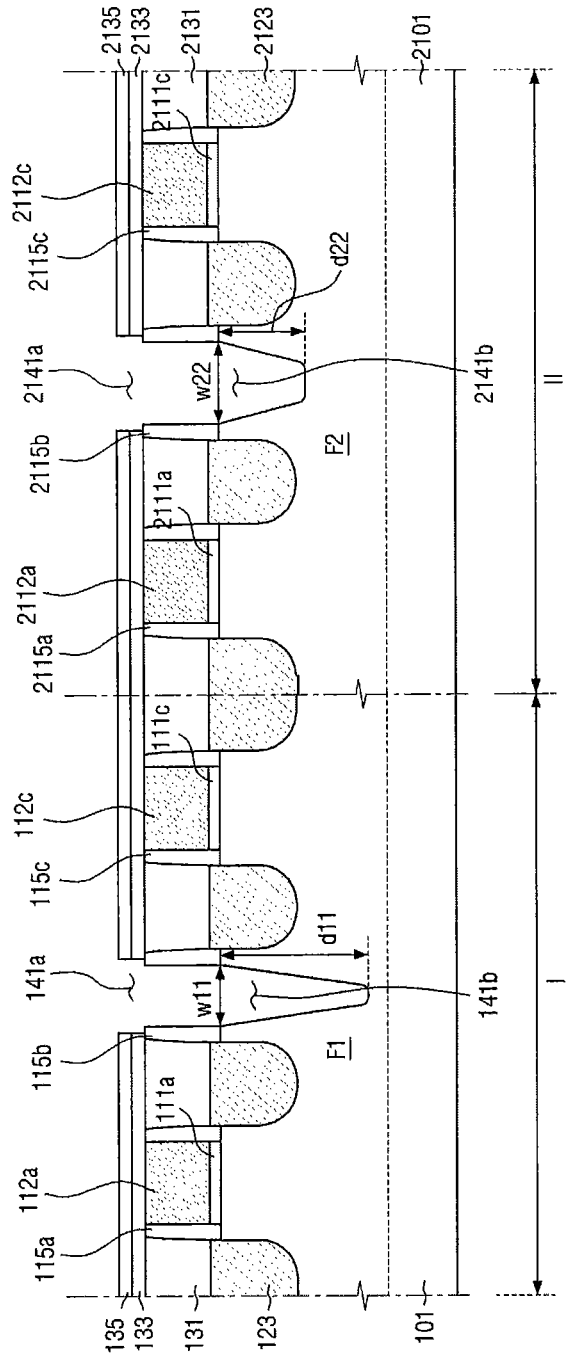

SEMICONDUCTOR DEVICES INCLUDING INSULATING MATERIALS IN FINS

CROSS-REFERENCE TO RELATED APPLICATIONS

This U.S. non-provisional patent application claims priority to U.S. Provisional Application No. 62/243,757, filed on Oct. 20, 2015 in the USPTO, and to Korean Patent Application No. 10-2015-0177286, filed on Dec. 11, 2015 in the Korean Intellectual Property Office, the disclosures of which are hereby incorporated herein by reference in their entireties.

BACKGROUND

The present disclosure relates to semiconductor devices. As one of various scaling techniques to increase the density of a semiconductor device, a multi-gate transistor has been proposed in which a fin-shaped or nanowire-shaped multi-channel active pattern (or silicon body) is formed on a substrate and gates are formed on a surface of the multi-channel active pattern. Further, as the feature size of a metal-oxide-semiconductor (MOS) transistor decreases, the length of a gate and the length of a channel that is formed below the gate also decrease. As the channel length of the transistor decreases, scattering of carriers (electrons or holes) in the channel may increase and mobility of the carriers may thus decrease. The decrease of the mobility of the carriers may cause obstacles to the improvement of the saturation current of the transistor.

SUMMARY

Various embodiments of the present disclosure provide a semiconductor device that has high integration and improved electrical characteristics. Various embodiments of the present disclosure provide a semiconductor device that can improve electrical characteristics based on the size of recesses.

A semiconductor device, according to some embodiments, may include a first substrate region and a second substrate region. The semiconductor device may include a first fin protruding from the first substrate region and including a first recess including a first cross-sectional area that is defined by a first width and a first depth. The semiconductor device may include a first isolation layer in the first recess. The semiconductor device may include a first source/drain region adjacent at least one side of the first recess and spaced apart from the first isolation layer. The semiconductor device may include a second fin protruding from the second substrate region and including a second recess including a second cross-sectional area that is defined by a second width and a second depth and is smaller than the first cross-sectional area. The semiconductor device may include a second isolation layer in the second recess. Moreover, the semiconductor device may include a second source/drain region adjacent at least one side of the second recess and spaced apart from the second isolation layer.

In some embodiments, the first depth of the first recess may be deeper than the second depth of the second recess. Additionally or alternatively, the first width of the first recess may be wider than the second width of the second recess.

According to some embodiments, the first and second isolation layers may include different respective lattice structures. For example, a lattice constant of the first isolation layer may be equal to or smaller than a lattice constant of the first fin or the first substrate region, and a lattice constant of the second isolation layer may be larger than a lattice constant of the second fin or the second substrate region.

In some embodiments, a first volume of the first isolation layer in the first recess may be larger than a second volume of the second isolation layer in the second recess. Additionally or alternatively, the semiconductor device may include a dummy gate structure on the first isolation layer. Moreover, the semiconductor device may include first and second spacers on the first fin, and the first isolation layer may protrude from the first recess to extend between the first and second spacers.

According to some embodiments, the first width and the first depth may be defined with respect to an upper surface of the first fin. The second width and the second depth may be defined with respect to an upper surface of the second fin. An upper surface of the first isolation layer may be coplanar with, or may protrude beyond, the upper surface of the first fin. Moreover, an upper surface of the second isolation layer may be coplanar with, or may protrude beyond, the upper surface of the second fin.

In some embodiments, the first depth of the first recess may be deeper in the first fin than a third depth of the first source/drain region. Moreover, the second depth of the second recess may be deeper in the second fin than a fourth depth of the second source/drain region.

According to some embodiments, a lattice constant of the first source/drain region may be equal to or smaller than a lattice constant of the first substrate region. Moreover, a lattice constant of the second source/drain region may be larger than a lattice constant of the second substrate region.

A semiconductor device, according to some embodiments, may include a first substrate region and a second substrate region. The semiconductor device may include a first fin protruding from the first substrate region. The first fin may include a first recess including a first width. The semiconductor device may include a first isolation layer in the first recess and extending to at least an upper surface of the first fin. The semiconductor device may include a first source/drain region adjacent at least one side of the first recess and spaced apart from the first isolation layer. The semiconductor device may include a second fin protruding from the second substrate region. The second fin may include a second recess including a second width that is different from the first width. The semiconductor device may include a second isolation layer in the second recess and extending to at least an upper surface of the second fin. The semiconductor device may include a second source/drain region adjacent at least one side of the second recess and spaced apart from the second isolation layer. Moreover, the first isolation layer may include a first volume in the first recess that is larger than a second volume of the second isolation layer in the second recess.

In some embodiments, the first recess may include a first depth and a first cross-sectional area that is defined by the first width and the first depth. The second recess may include a second depth and a second cross-sectional area that is defined by the second width and the second depth. Moreover, the first cross-sectional area may be larger than the second cross-sectional area.

According to some embodiments, a lattice constant of the first isolation layer may be equal to or smaller than a lattice constant of the first fin or the first substrate region. Moreover, a lattice constant of the second isolation layer may be larger than a lattice constant of the second fin or the second substrate region.

A semiconductor device, according to some embodiments, may include a first substrate region and a second substrate region. The semiconductor device may include a first fin protruding from the first substrate region and including a first recess. The semiconductor device may include a gate structure that extends across the first fin and is spaced apart from the first recess. The semiconductor device may include a first isolation layer in the first recess. The semiconductor device may include a dummy gate structure on the first isolation layer. The semiconductor device may include a first source/drain region in the first fin between the gate structure and the dummy gate structure. The semiconductor device may include a second fin protruding from the second substrate region and including a second recess. The semiconductor device may include a second isolation layer in the second recess. The semiconductor device may include a second source/drain region adjacent at least one side of the second recess and spaced apart from the second isolation layer. The first recess may include a first depth in the first fin that is deeper than a second depth of the first source/drain region in the first fin. The second recess may include a third depth in the second fin that is deeper than a fourth depth of the second source/drain region in the second fin. Moreover, the first recess and the second recess may include different respective depths and/or widths.

In some embodiments, the first recess may include a first width that is coplanar with an upper surface of the first fin. The second recess may include a second width that is coplanar with an upper surface of the second fin. The first width may be wider than the second width.

According to some embodiments, the first depth of the first recess may be defined with respect to an upper surface of the first fin. The third depth of the second recess may be defined with respect to an upper surface of the second fin. Moreover, the first depth may be deeper than the third depth.

In some embodiments, an upper surface of the first isolation layer may be coplanar with, or may extend beyond, an upper surface of the first fin. An upper surface of the second isolation layer may be coplanar with, or may extend beyond, an upper surface of the second fin. Moreover, a first volume of the first isolation layer in the first recess may be larger than a second volume of the second isolation layer in the second recess.

According to some embodiments, the first isolation layer and the second isolation layer may include different respective lattice structures. For example, a lattice constant of the first isolation layer may be equal to or smaller than a lattice constant of the first fin or the first substrate region, and a lattice constant of the second isolation layer may be larger than a lattice constant of the second fin or the second substrate region.

A semiconductor device, according to some embodiments, may include first and second metal-oxide-semiconductor (MOS) device regions including opposite MOS device types, respectively. The first MOS device region may include a first semiconductor fin. The first MOS device region may include first and second gate structures on first and second portions of the first semiconductor fin. The first MOS device region may include a first insulating material in a third portion of the first semiconductor fin that is between the first and second portions of the first semiconductor fin. The second MOS device region may include a second semiconductor fin. The second MOS device region may include third and fourth gate structures on first and second portions of the second semiconductor fin. The second MOS device region may include a second insulating material in a third portion of the second semiconductor fin that is between the first and second portions of the second semiconductor fin. Moreover, a first volume of the first insulating material in the first semiconductor fin may be larger than a second volume of the second insulating material in the second semiconductor fin.

In some embodiments, the first and second MOS device regions may include NMOS and PMOS device regions, respectively. A ratio of the larger first volume to the second volume may be configured to provide a higher tensile stress in the NMOS device region than an equal ratio. Moreover the ratio of the larger first volume to the second volume may be configured to provide a higher compressive stress in the PMOS device region than the equal ratio.

According to some embodiments, the first insulating material may include a first depth in the first semiconductor fin of the NMOS device region that is deeper than a second depth of the second insulating material in the second semiconductor fin of the PMOS device region. Moreover, the semiconductor device may include a source/drain region between the first insulating material and one of the first and second portions of the first semiconductor fin. The first depth of the first insulating material may be deeper than a third depth of the source/drain region in the first semiconductor fin. Additionally or alternatively, an uppermost surface of the first insulating material may be coplanar with, or may protrude beyond, an uppermost surface of the first semiconductor fin.

Other features and example embodiments will be apparent from the following detailed description, the drawings, and the claims.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
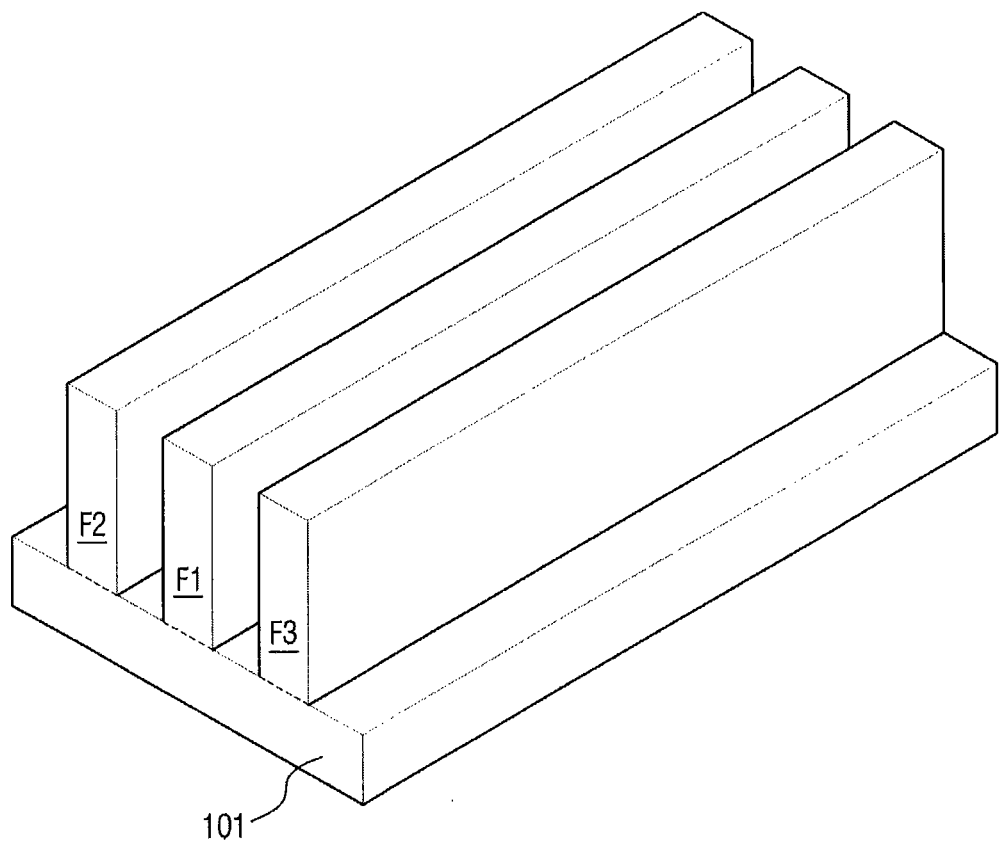
FIGS. 1 to 22 are views illustrating fabrication of a semiconductor device according to some embodiments of the present disclosure.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, a semiconductor device according to various embodiments of the present disclosure will be described with reference to FIGS. 1 to 22.

FIGS. 1 to 22 are views illustrating/explaining fabrication of a semiconductor device according to some embodiments of the present disclosure. FIGS. 1 to 14D are views illustrating/explaining formation of recesses included in a semiconductor device according to some embodiments of the present disclosure, and FIGS. 14A to 14D are views illustrating/explaining a semiconductor device including different recesses in different regions.

Figure 2:
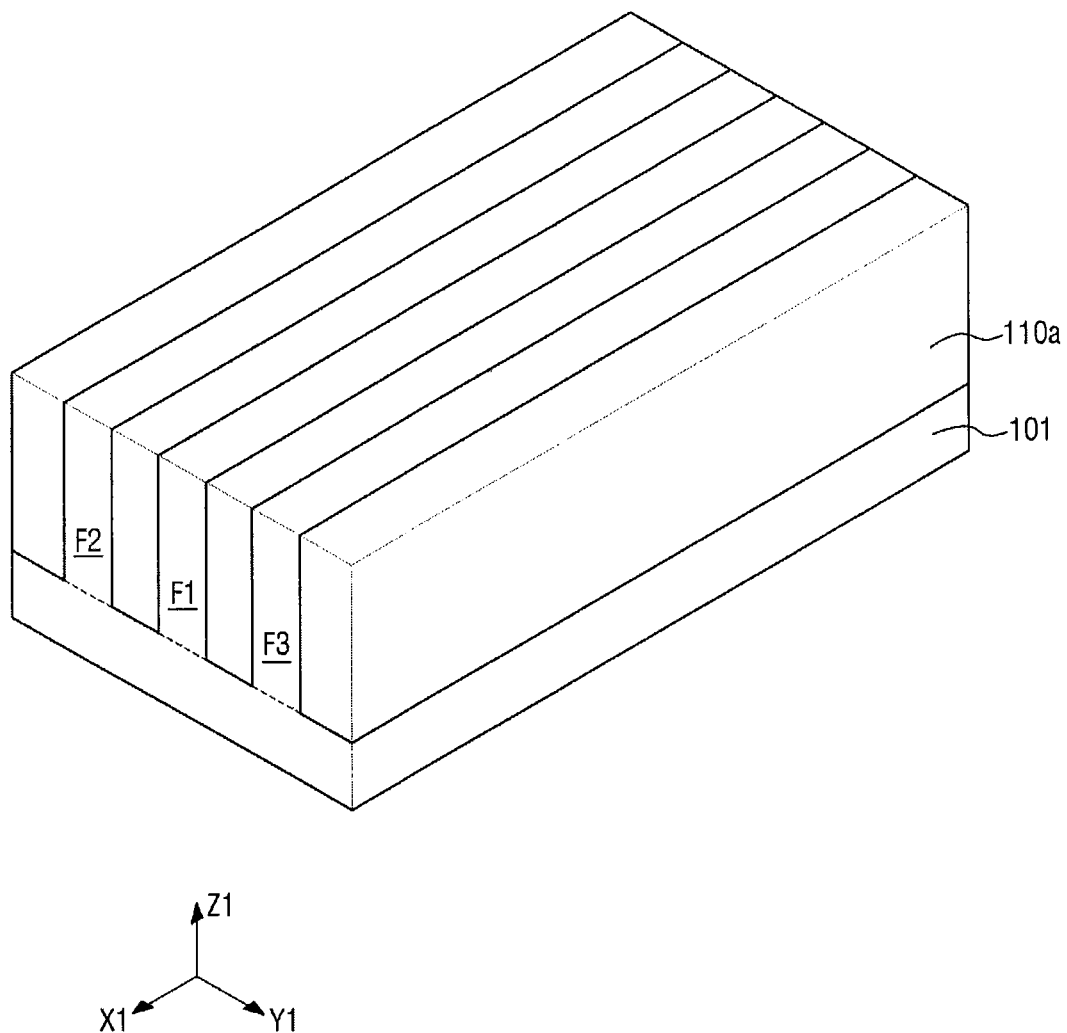
Figure 3:
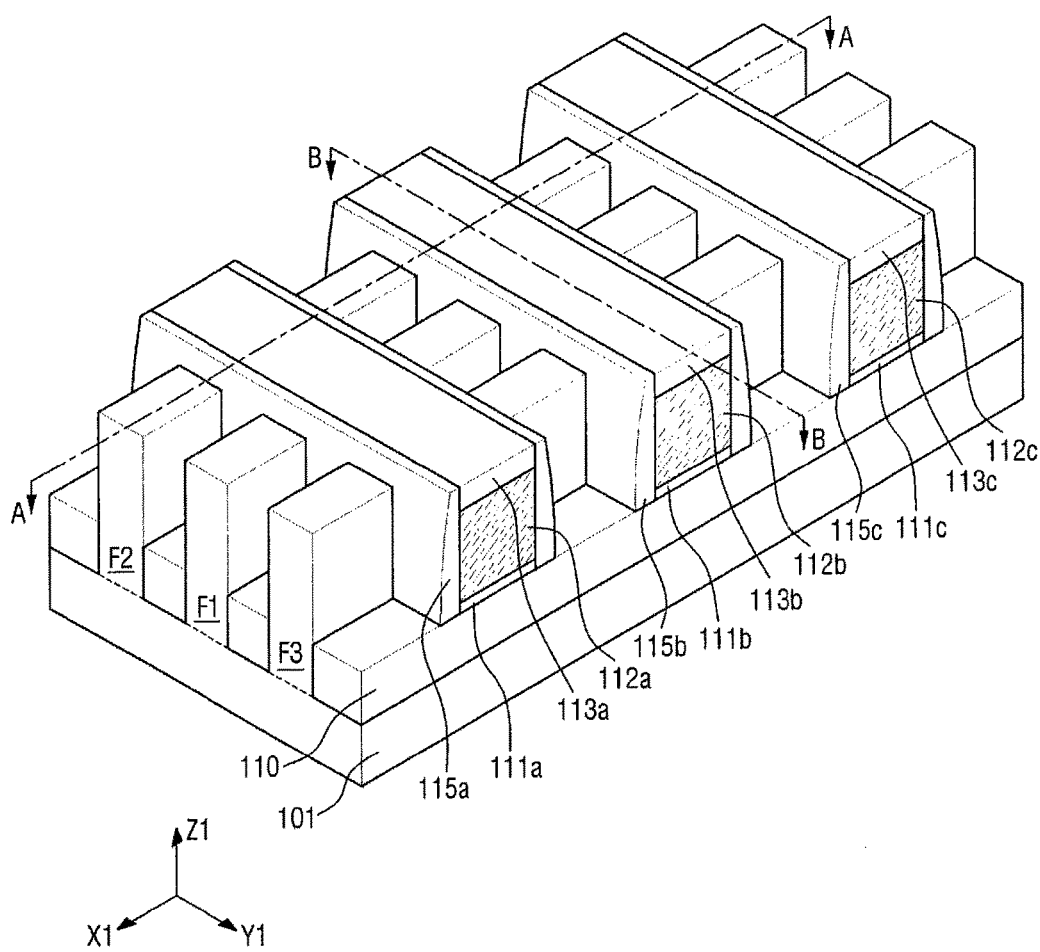
Figure 4A:
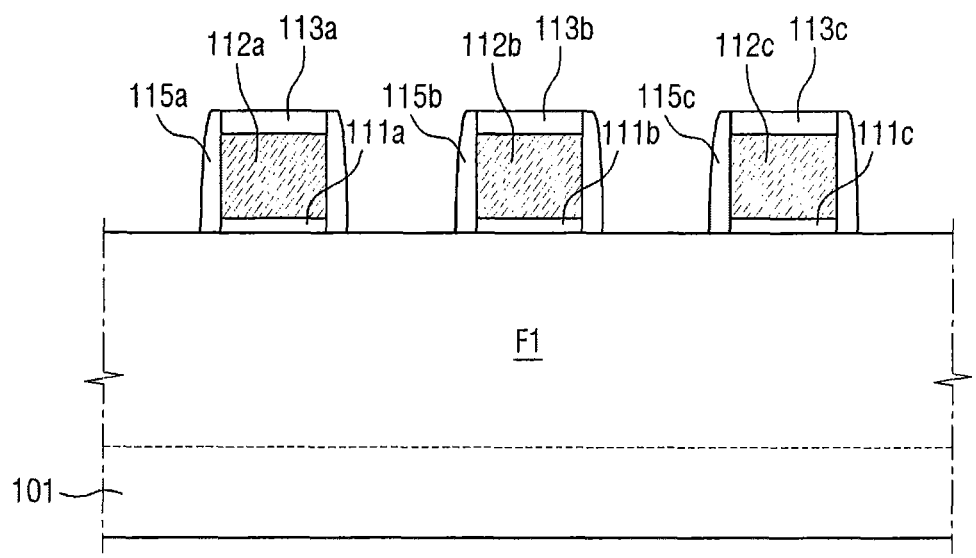
Figure 4B:
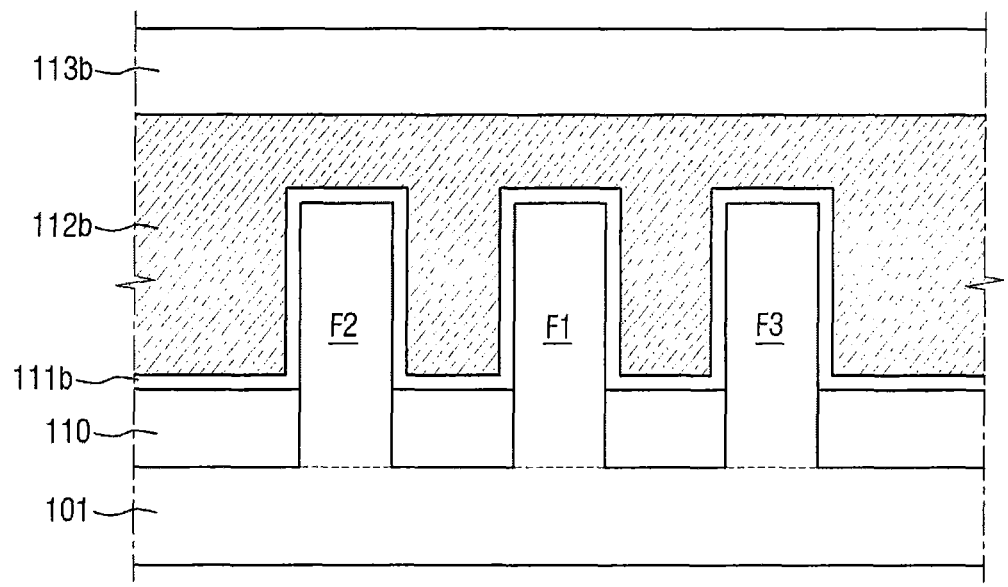
Figure 5:
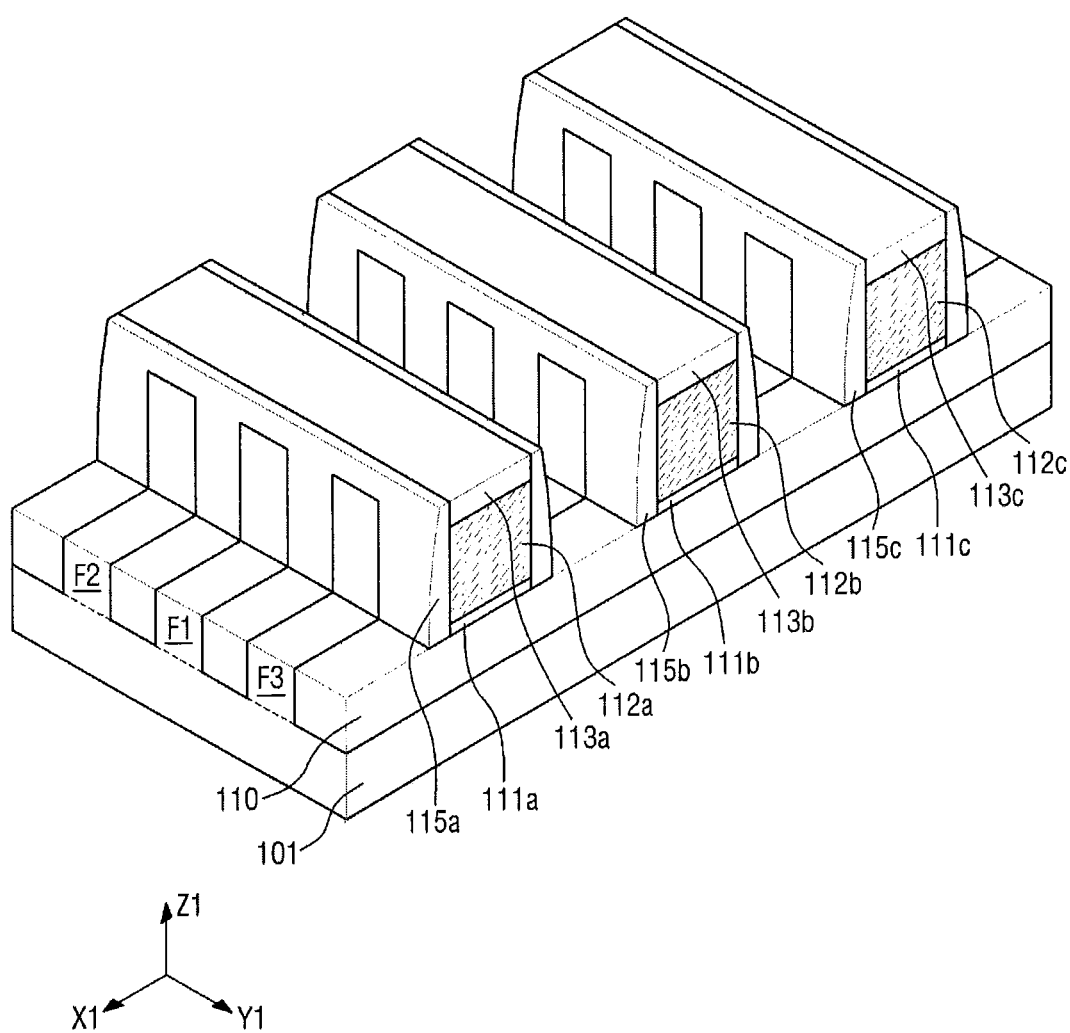
Figure 6:
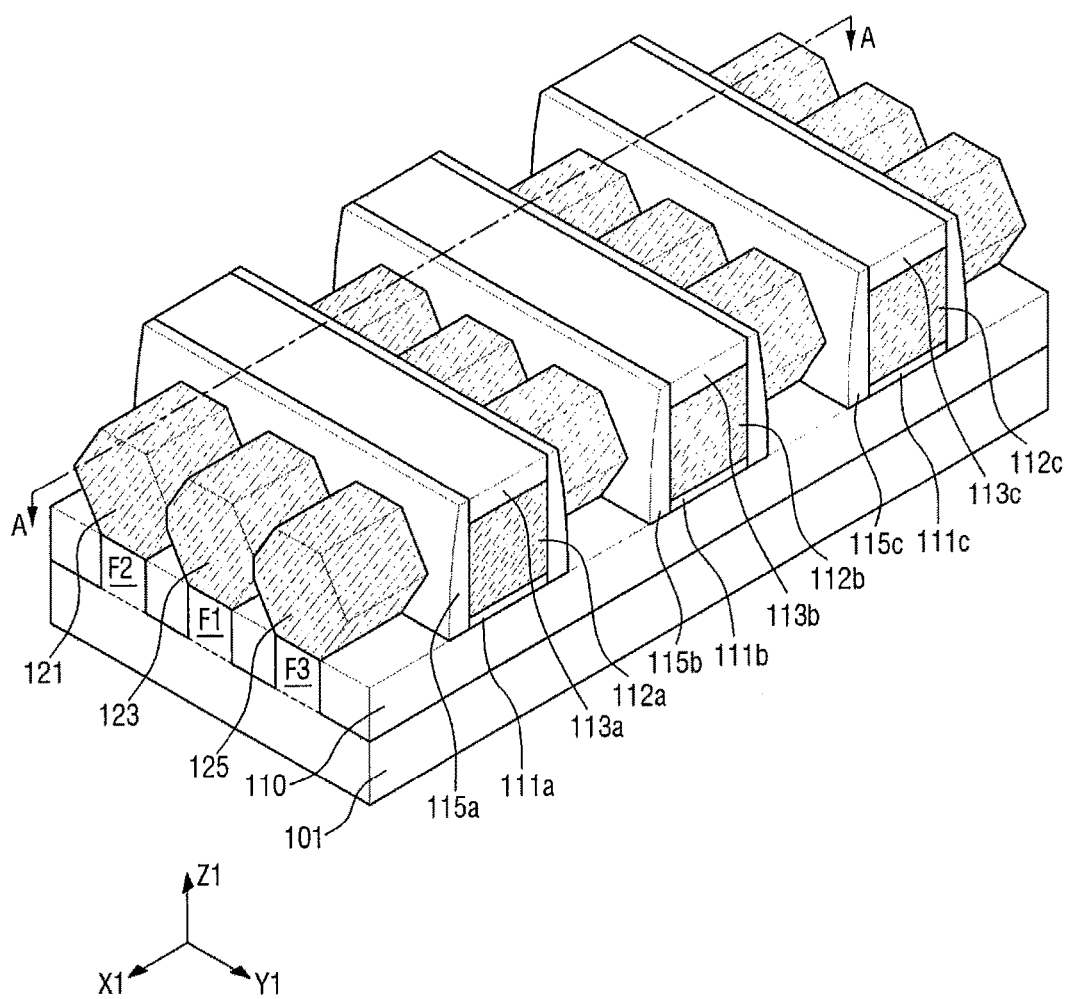
Figure 7:
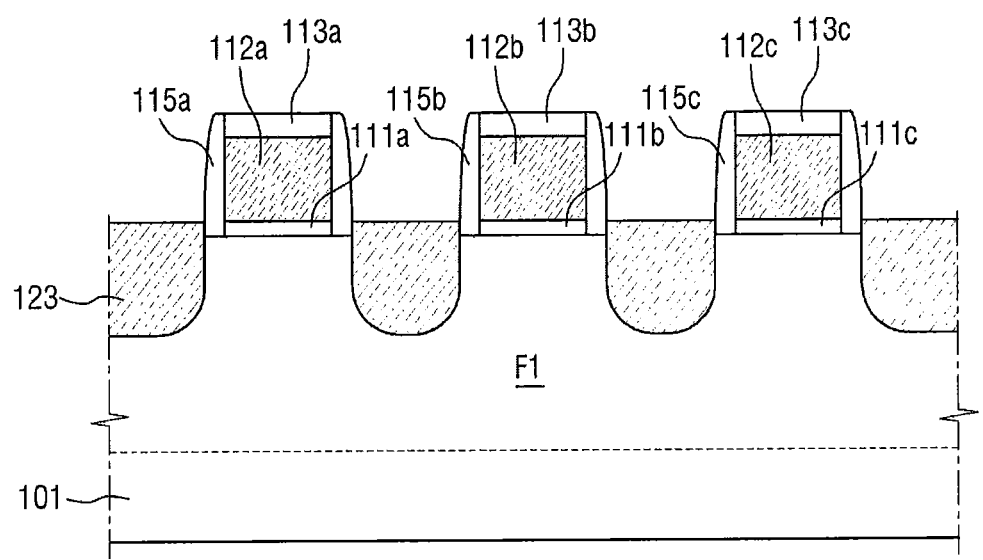
Figure 19:
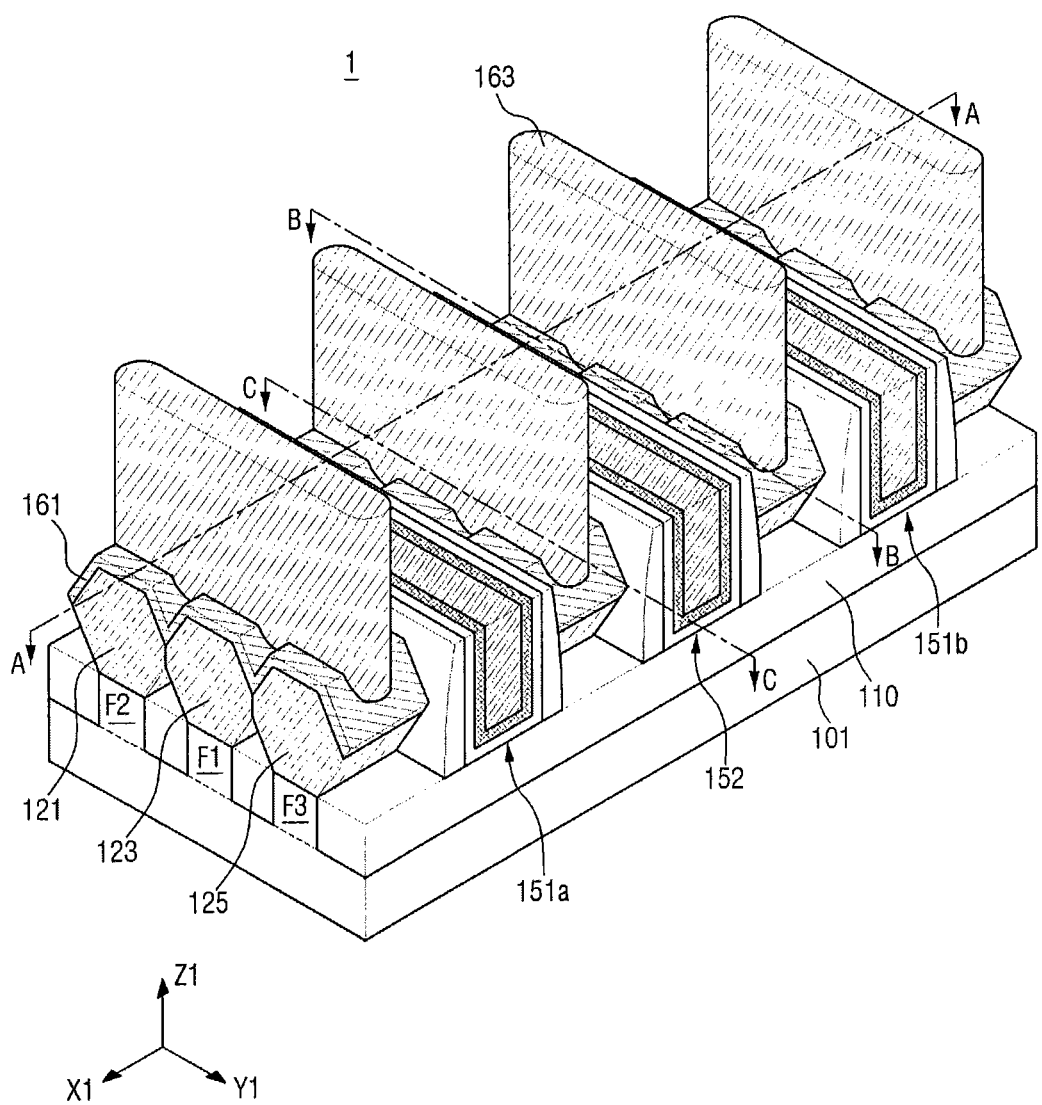
Figure 20:
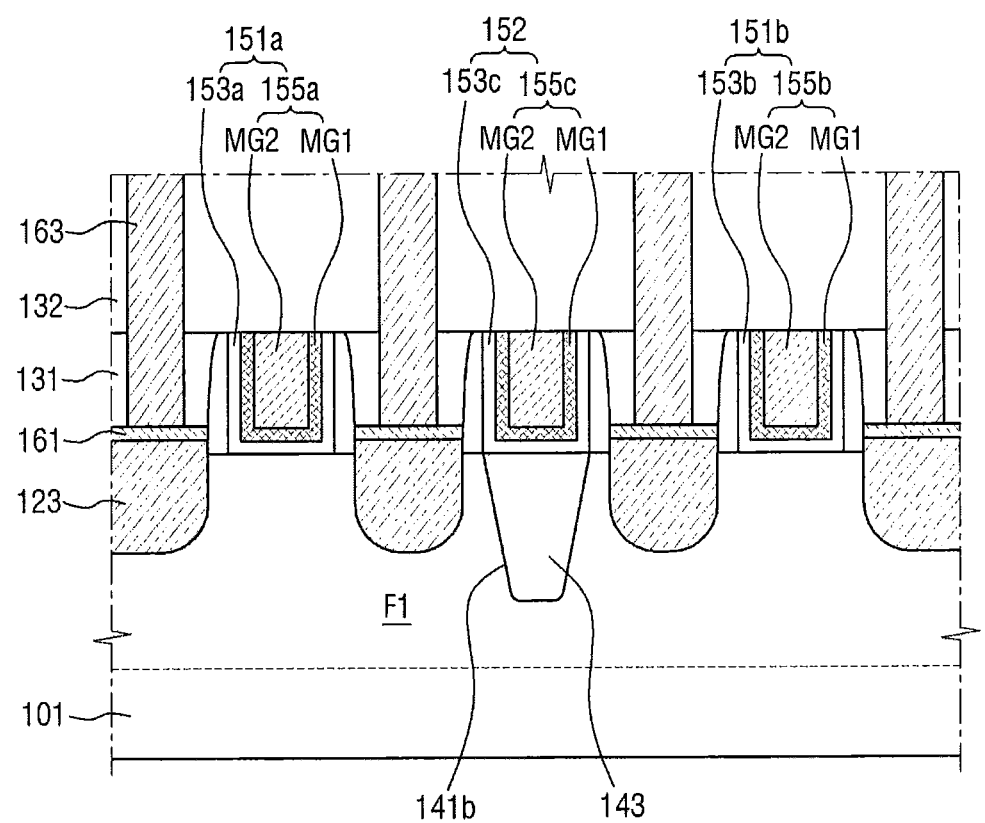
Figure 21:
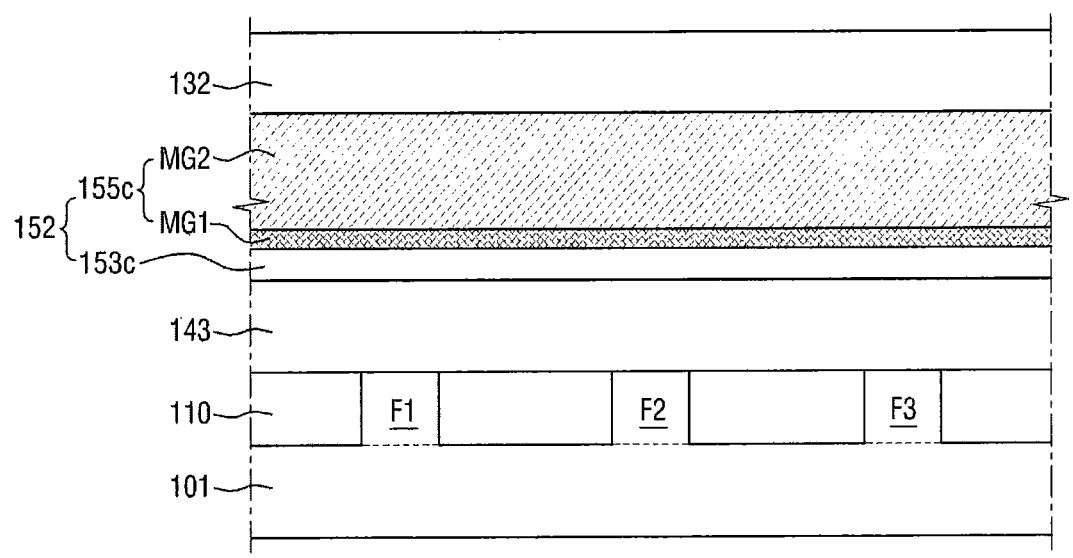
Figure 22:
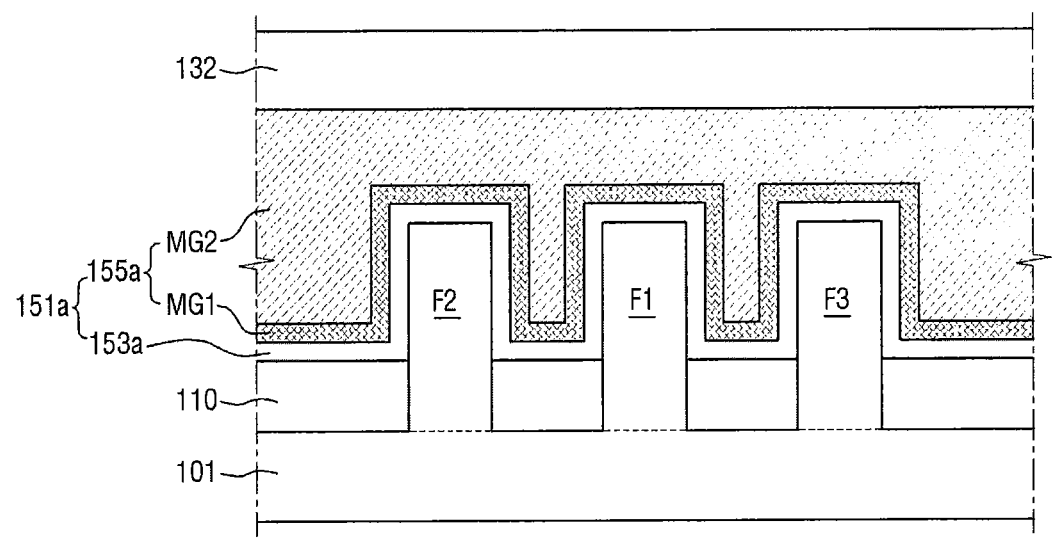

FIGS. 1 to 3, 5, 6, 8, and 19 are perspective views. FIG. 4A is a cross-sectional view taken along line A-A of FIG. 3, and FIG. 4B is a cross-sectional view taken along line B-B of FIG. 3. FIG. 7 is a cross-sectional view taken along line A-A of FIG. 6, and FIG. 9 is a cross-sectional view taken along line A-A of FIG. 8. FIG. 20 is a cross-sectional view taken along line A-A of FIG. 19, FIG. 21 is a cross-sectional view taken along line B-B of FIG. 19, and FIG. 22 is a cross-sectional view taken along line C-C of FIG. 19.

Referring to FIG. 1, first to third fins F1 to F3 are formed on a substrate 101. The first to third fins F1 to F3 are formed on the substrate 101, and may project (e.g., protrude) in a third direction Z1. The first to third fins F1 to F3 may extend a longest distance along a first direction X1 that is a length direction of the fins F1 to F3, and may have long sides in the first direction X1 and short sides in the second direction Y1. However, the present disclosure is not limited thereto, and for example, the long side direction may be the second direction Y1 and the short side direction may be the first direction X1.

The first to third fins F1 to F3 may be arranged to be spaced apart from one another, and the long sides thereof may be arranged in parallel to one another, but are not limited thereto. The first to third fins F1 to F3 may be arranged to be spaced apart from one another with their short sides arranged in parallel to one another.

On the other hand, the substrate 101 may be made of at least one semiconductor material selected from the group including silicon (Si), germanium (Ge), silicon germanium (SiGe), gallium phosphide (GaP), gallium arsenide (GaAs), silicon carbide (SiC), silicon germanium carbon (SiGeC), indium arsenide (InAs), and indium phosphide (InP). Further, the substrate 101 may be an SOI (Silicon On Insulator) substrate.

Each of the first to third fins F1 to F3 may be a portion/part of the substrate 101 and may include an epitaxial layer that is grown from the substrate 101. For example, the first to third fins may include Si or SiGe.

Referring to FIG. 2, an insulating layer 110a is formed to cover the first to third fins F1 to F3. The insulating layer 110a may be formed of a material that includes at least one of silicon oxide, silicon nitride, and silicon oxynitride.

Referring to FIGS. 3 to 4B, a field insulating layer 110 is formed by recessing an upper portion of the insulating layer 110a, thus exposing upper portions of the first to third fins F1 to F3. This recess process may include a selective etching process.

In some embodiments, portions/parts of the first to third fins F1 to F3 that are exposed over/beyond the field insulating layer 110 may be formed by an epitaxial process. For example, after the insulating layer 110a is formed, portions/parts of the first to third fins F1 to F3 may be formed by an epitaxial process using upper surfaces of the first to third fins F1 to F3 that are exposed by the insulating layer 110a, without using the recess process as a seed.

Further, doping for adjusting threshold voltages may be performed with respect to the exposed first to third fins F1 to F3. For example, in the case of forming an NMOS transistor, an impurity may be boron (B), and in the case of forming a PMOS transistor, an impurity may be phosphorus (P) or arsenic (As).

Then, first to third sacrificial gate insulating layers 111a, 111b, and 111c that cross the first to third fins F1 to F3 are formed on the first to third fins F1 to F3, and first to third sacrificial gate electrodes 112a, 112b, and 112c are formed on the first to third sacrificial gate insulating layers 111a, 111b, and 111c. The first to third sacrificial gate electrodes 112a, 112b, and 112c are spaced apart from one another.

Although FIG. 3 illustrates that the first to third sacrificial gate electrodes 112a, 112b, and 112c cross the first to third fins F1 to F3 at right angles, that is, in the first direction X1, the present disclosure is not limited thereto. The first to third sacrificial gate electrodes 112a, 112b, and 112c may cross the first to third fins F1 to F3 at acute and/or obtuse angles with respect to the first direction X1.

The first to third sacrificial gate insulating layers 111a, 111b, and 111c and the first to third sacrificial gate electrodes 112a, 112b, and 112c may be formed on upper surfaces and upper portions of side walls of the first to third fins F1 to F3.

The first to third sacrificial gate insulating layers 111a, 111b, and 111c may be conformally formed along the upper surfaces and the side walls of the first to third fins F1 to F3. Further, the first to third sacrificial gate insulating layers 111a, 111b, and 111c may be arranged on the field insulating layer 110.

In some embodiments, the first to third sacrificial gate insulating layers 111a, 111b, and 111c may be, for example, silicon oxide layers. The first to third sacrificial gate electrodes 112a, 112b, and 112c may be made of, for example, polysilicon, but are not limited thereto.

First to third hard mask layers 113a, 113b, and 113c may be respectively formed on the first to third sacrificial gate electrodes 112a, 112b, and 112c. The first to third hard mask layers 113a, 113b, and 113c may be formed of a material that includes at least one of silicon oxide, silicon nitride, and silicon oxynitride.

Then, first to third spacers 115a, 115b, and 115c are formed on both side walls of the first to third sacrificial gate electrodes 112a, 112b, and 112c. The first to third spacers 115a, 115b, and 115c may expose the upper surfaces of the first to third hard mask layers 113a, 113b, and 113c. The first to third spacers 115a, 115b, and 115c may be made of silicon nitride or silicon oxynitride, and unlike those as illustrated in FIG. 3, the first to third spacers 115a, 115b, and 115c may be formed as a stacked multilayer other than a single layer.

Referring to FIG. 5, the first to third fins F1 to F3 are etched. Except for the portions that are covered by the spacers 115 or the first to third sacrificial gate insulating layers 111a, 111b, and 111c, the remaining portions of the first to third fins F1 to F3 are etched.

Accordingly, the first to third fins F1 to F3 that are exposed between the first to third sacrificial gate insulating layers 111a, 111b, and 111c may be etched. The first to third fins F1 to F3 may be etched using the first to third spacers 115a, 115b, and 115c and the first to third hard mask layers 113a, 113b, and 113c as etching masks.

Referring to FIGS. 6 and 7, first to third source/drain regions 121, 123, and 125 are formed on the etched portions of the first to third fins F1 to F3. The first source/drain region 123 may be formed in/on the first fin F1, the second source/drain region 121 may be formed in/on the second fin F2, and the third source/drain region 125 may be formed in/on the third fin F3. The first to third source/drain regions 121, 123, and 125 may be elevated source/drain regions. Accordingly, the upper surfaces of the first to third source/drain regions 121, 123, and 125 may be higher than the upper surfaces of the first to third fins F1 to F3.

If the semiconductor device that is fabricated according to FIG. 6 is a PMOS transistor, the first to third source/drain regions 121, 123, and 125 may include a compression (e.g., compressive) stress material. For example, the compression stress material may be a material having larger lattice constant than the lattice constant of Si, and for example, SiGe. The compression stress material may apply a compression stress to the first to third fins F1 to F3 on the lower portions of first and second gate structures 151a and 151b (e.g., in FIG. 18), that is, a channel region, to improve carrier mobility of the channel region.

If the semiconductor device that is fabricated according to FIG. 6 is an NMOS transistor, the first to third source/drain regions 121, 123, and 125 may include a tensile stress material. The first to third source/drain regions 121, 123, and 125 may be made of the same material as the material of the substrate 101 or the tensile stress material. For example, if the substrate 101 is made of Si, the first to third source/drain regions 121, 123, and 125 may be made of Si or a material having smaller lattice constant that the lattice constant of Si (e.g., SiC or silicon phosphide (SiP)). In some embodiments, the first to third source/drain regions 121, 123, and 125 may include Group III-V semiconductor materials or Group IV semiconductor materials, but are not limited thereto.

The first to third source/drain regions 121, 123, and 125 may be formed through epitaxial growth.

In some embodiments, although FIG. 6 illustrates that the first to third source/drain regions 121, 123, and 125 come in contact with one another, the present disclosure is not limited thereto. The first to third source/drain regions 121, 123, and 125 may be formed to be spaced apart from one another.

Figure 8:
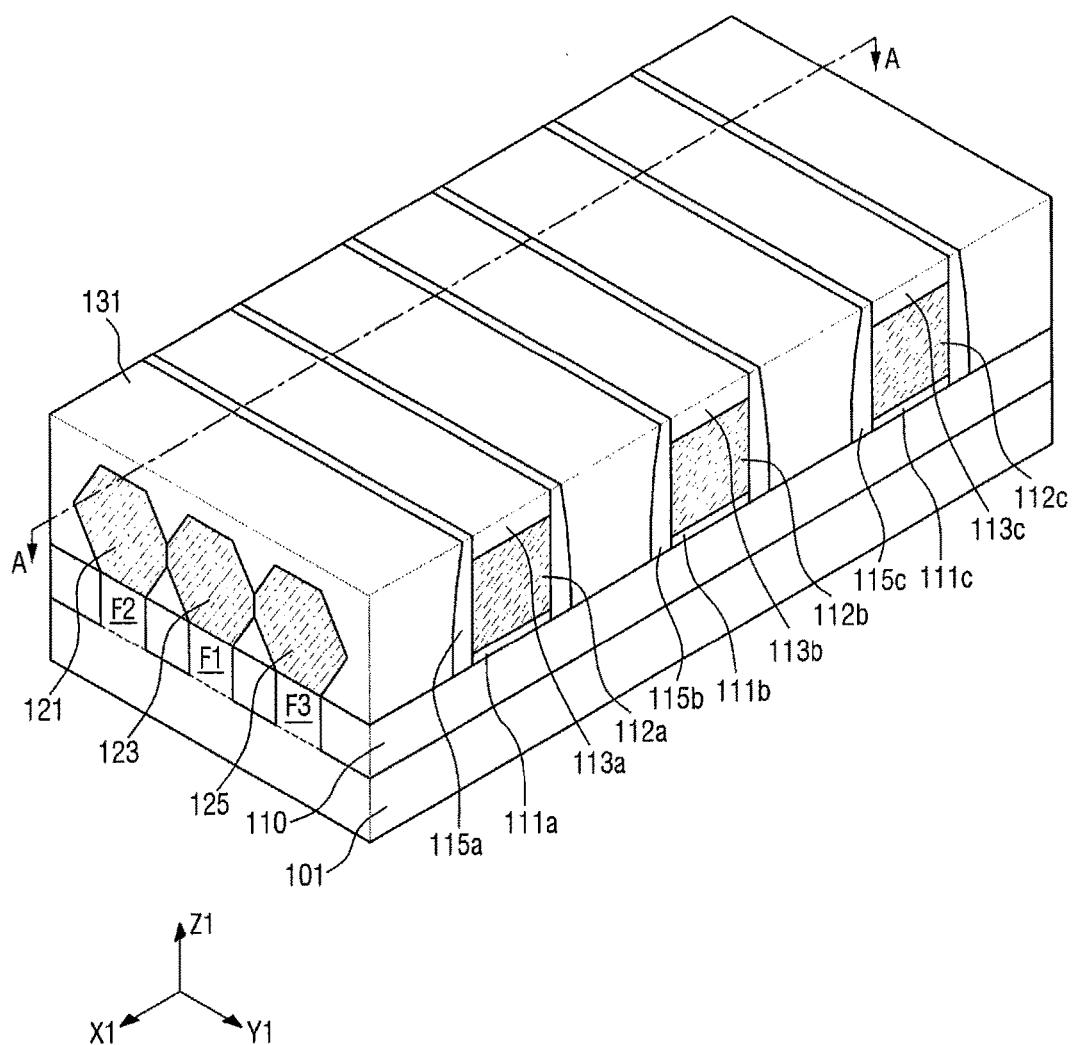
Figure 9:
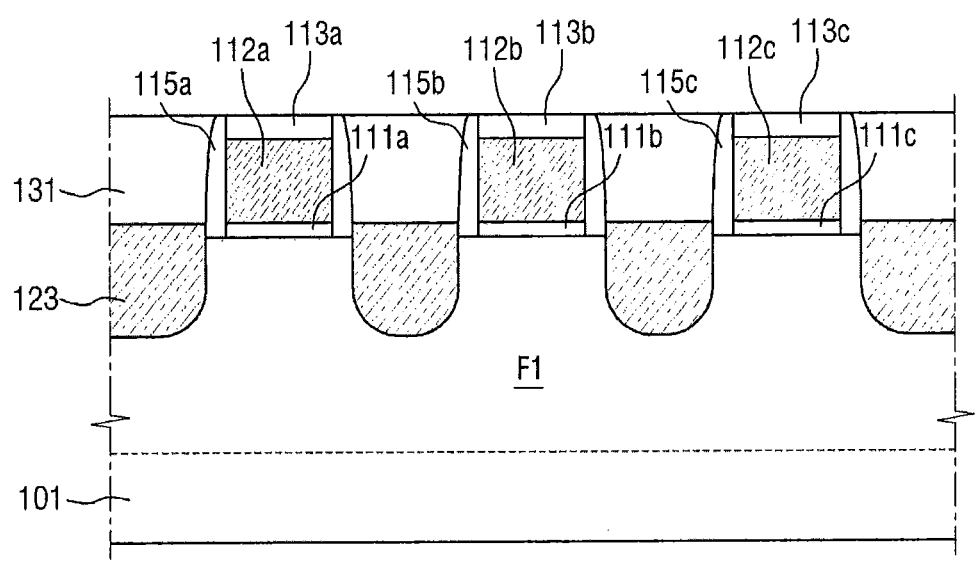

Referring to FIGS. 8 and 9, a first interlayer insulating layer 131 that covers the first to third source/drain regions 121, 123, and 125 is formed. The first interlayer insulating layer 131 may cover side walls of the first to third spacers 115a, 115b, and 115c, and expose upper surfaces of the first to third hard mask layers 113a, 113b, and 113c. The first interlayer insulating layer 131 may include, for example, an oxide layer.

Figure 10:
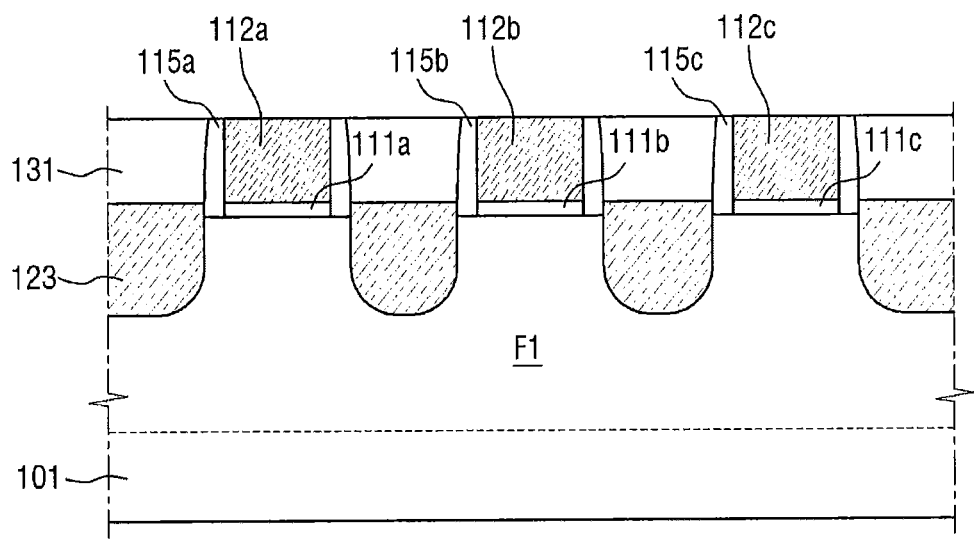

Referring to FIG. 10, the upper surfaces of the first to third sacrificial gate electrodes 112a, 112b, and 112c are exposed through removal of the first to third hard mask layers 113a, 113b, and 113c.

In order to remove the first to third hard mask layers 113a, 113b, and 113c, a planarization process (e.g., CMP process) may be performed, and during the planarization process, the first interlayer insulating layer 131 may be partially etched.

After the planarization process is performed, a cleaning process is performed to remove undesired elements/substances that remain after the planarization process. The upper surface of the first interlayer insulating layer 131 may be positioned on the same plane as the upper surfaces of the first to third sacrificial gate electrodes 112a, 112b, and 112c, but is not limited thereto. That is, the first interlayer insulating layer 131 may be partially removed during the planarization process as described above, and thus the upper surface of the first interlayer insulating layer 131 may be lower than the upper surfaces of the first to third sacrificial gate electrodes 112a, 112b, and 112c.

Figure 11:
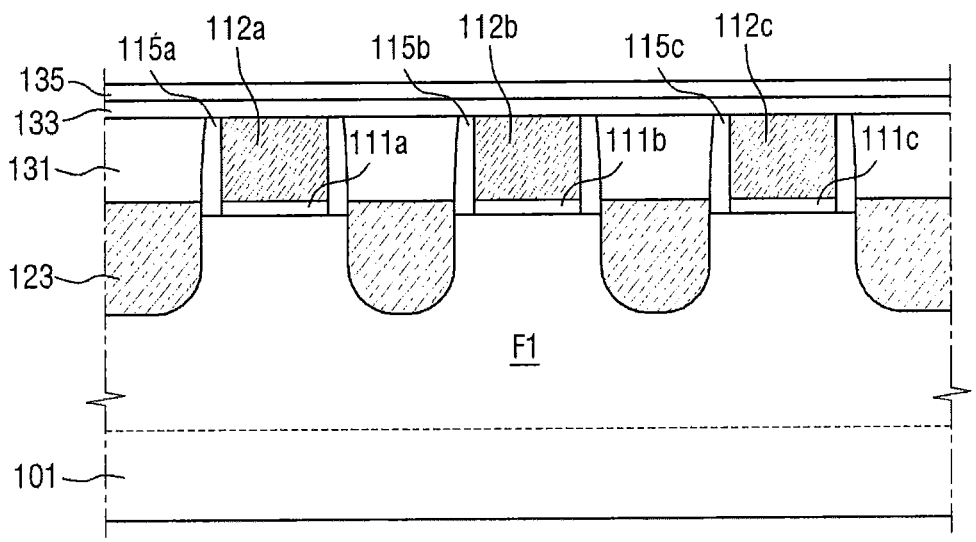

Referring to FIG. 11, a passivation layer 133, which covers upper surfaces of the first interlayer insulating layer 131 and the first to third sacrificial gate electrodes 112a, 112b, and 112c, and a first insulating layer 135 are formed. The passivation layer 133 may protect/prevent the first interlayer insulating layer 131 from being etched in a subsequent process. The passivation layer 133 may include, for example, a nitride layer and an oxynitride layer.

The first insulating layer 135 is formed to offset a step height that occurs during formation of the passivation layer 133. If a portion/part of the first interlayer insulating layer 131 is removed during the planarization process as described above, the step height may occur on the upper surface of the first interlayer insulating layer 131 and the upper surfaces of the first to third sacrificial gate electrodes 112a, 112b, and 112c. In this case, if the passivation layer 133 is formed, the formed passivation layer 133 becomes uneven, and concave portions may occur on the first interlayer insulating layer 131. The first insulating layer 135 may fill the concave portions of the passivation layer 133 to make the upper surface of the first insulating layer 135 even. The first insulating layer 135 may include the same material as the material of the first interlayer insulating layer 131.

Figure 12:
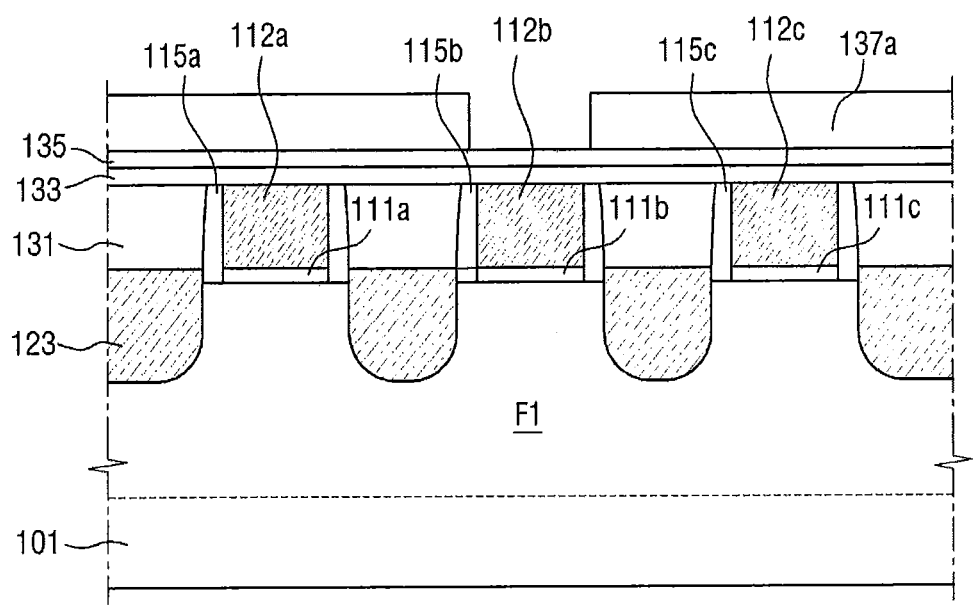

Referring to FIG. 12, an etch mask pattern 137a is formed on the passivation layer 133. The etch mask pattern 137a may expose the upper portion of the second sacrificial gate electrode 112b and may cover the remaining sacrificial gate electrodes 112a and 112c.

Figure 13:
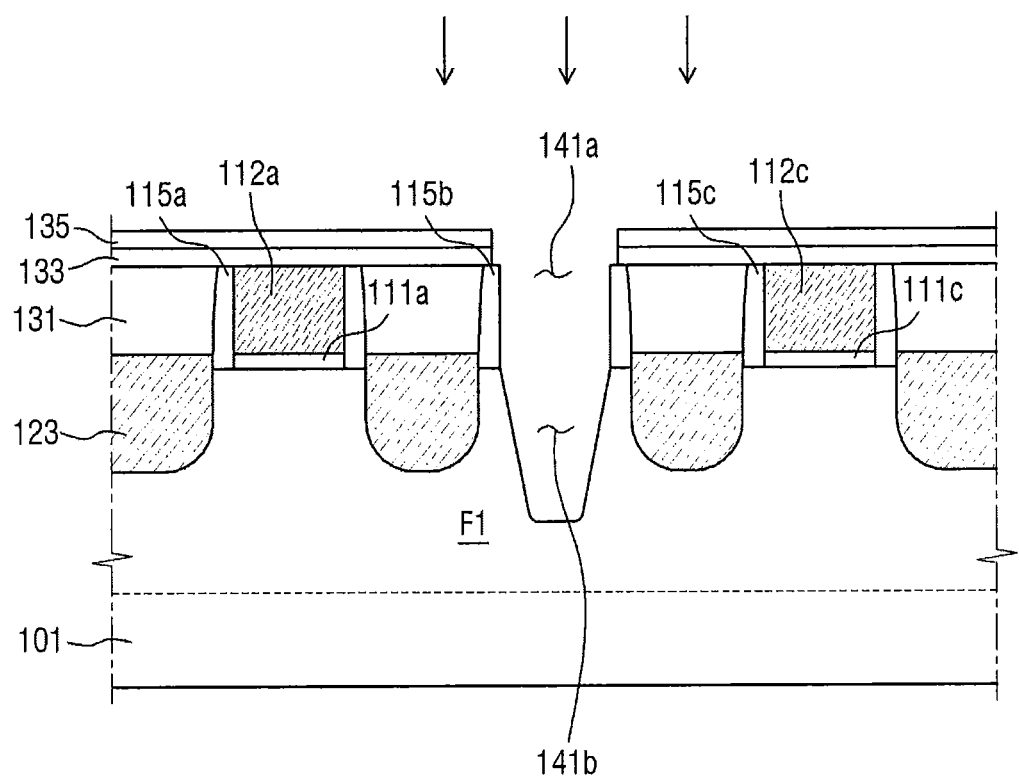

Referring to FIG. 13, the second sacrificial gate electrode 112b and the second sacrificial gate insulating layer 111b are removed to form a first trench 141a and a first recess 141b.

Specifically, the passivation layer 133 on the second sacrificial gate electrode 112b is first removed using the etch mask pattern 137a, and then the second sacrificial gate electrode 112b and the second sacrificial gate insulating layer 111b are removed through an etching process to form the first trench 141a. The first to third fins F1 to F3 are exposed by the first trench 141a and the exposed portion is removed to form the first recess 141b.

The first recess 141b may be formed to be spaced apart from the first to third source/drain regions 121, 123, and 125. The lower surface of the first recess 141b may be equal to or lower than the lower surfaces of the first to third source/drain regions 121, 123, and 125.

The etching process may be an anisotropic etching process or an isotropic etching process. The etching process may be a wet etching process or a dry etching process. If the etching process is a dry etching process, plasma etching, reactive ion etching (RIE), or reactive ion beam etching may be performed.

Although FIG. 13 illustrates that the first recess 141b is in the shape of a trench of which the width becomes narrower in a direction from an upper portion to a lower portion thereof, the first recess 141b may have various shapes. For example, the first recess 141b may be in the shape of a "V", a rectangle, an angled "U", a "U", or an ellipse. However, the present disclosure is not limited thereto.

In some embodiments, the first recess 141b may have various sizes. That is, the first recess 141b may have different sizes depending on whether the semiconductor device that is fabricated according to FIG. 13 is a PMOS transistor or an NMOS transistor.

That is, in the case where the semiconductor device that is fabricated according to FIG. 13 is a PMOS transistor, the first recess 141b may be relatively smaller than the first recess 141b in the case where the semiconductor device is an NMOS transistor.

More specifically, in the case where the semiconductor device that is fabricated according to FIG. 13 is an NMOS transistor, the tensile stress may be increased as the first recess 141b becomes larger, and thus the electrical characteristics of the semiconductor device can be improved. Further, in the case where the semiconductor device that is fabricated according to FIG. 13 is a PMOS transistor, the compression (e.g., compressive) stress may be increased as the first recess 141b becomes smaller, and thus the electrical characteristics of the semiconductor device can be improved.

Accordingly, the size of the first recess 141b that is included in the semiconductor device according to the present disclosure may be determined in accordance with the kind/type of semiconductor device (i.e., PMOS vs. NMOS).

In relation to this, explanation will be made in more detail with reference to FIGS. 14A to 14D.

In FIGS. 14A to 14D, a first region I may be a region in which a semiconductor device that corresponds to the semiconductor device as described above with reference to FIGS. 1 to 13 is arranged. A second region II may be a region in which a semiconductor device that is substantially the same as the semiconductor device as described above with reference to FIGS. 1 to 13 except for the size of a second recess 2141b is arranged, or a region in which another kind/type of semiconductor device is arranged.

The first region I and the second region II may be divided in accordance with the arrangement and operation of the semiconductor device. For example, the first region I may be a logic region, and the second region II may be an SRAM region. Further, the first region I may be a region in which a driving voltage is high, and the second region II may be a region in which the driving voltage is low.

Further, the first region I may be a region in which an NMOS transistor is formed, and the second region II may be a region in which a PMOS transistor is formed. However, the present disclosure is not limited thereto.

In some embodiments, the first region I and the second region II may be regions that continue on the same substrate 101 or regions that are separated and spaced apart from each other.

In some embodiments, the second region II may be configured so that a second fin F2, a second source/drain region 2123, a second interlayer insulating layer 2131, fourth to sixth spacers 2115a, 2115b, and 2115c, a second passivation layer 2133, a second insulating layer 2135, fourth and sixth sacrificial gate insulating layers 2111a and 2111c, and fourth and sixth sacrificial gate electrodes 2112a and 2112c, which are formed on a substrate 2101, substantially correspond to the first fin F1, the first source/drain region 123, the first interlayer insulating layer 131, the first to third spacers 115a, 115b, and 115c, the passivation layer 133, the first insulating layer 135, the first and third sacrificial gate insulating layers 111a and 111c, and the first and third sacrificial gate electrodes 112a and 112c, respectively. Accordingly, repeated descriptions may be omitted.

In FIG. 14A, it is assumed that the first region I is a region in which an NMOS transistor is formed, and the second region II is a region in which a PMOS transistor is formed. However, this is an example to explain the present disclosure, and inventive concepts of the present disclosure are not limited thereto.

If the first region I is a region in which an NMOS transistor is formed, and the second region II is a region in which a PMOS transistor is formed, the electrical characteristics of the semiconductor device can be improved in the case where the size of the first recess 141b is larger than the size of the second recess 2141b.

This is because, if the size of the first recess 141b is larger than the size of the second recess 2141b, a tensile stress may be applied to the NMOS transistor that is formed in the first region I, and a compression stress may be applied to the PMOS transistor that is formed in the second region II. Through this, carrier mobility of the channel region may be improved by applying the compression or tensile stress to the channel region included in each of the transistors.

Further, in a subsequent process, a first isolation layer that fills the first recess 141b may be made of a tensile stress material having a lattice constant that is equal to or smaller than the lattice constant of a material included in the first fin F1 or the substrate 101. Further, a second isolation layer that fills the second recess 2141b may be made of a compression stress material having a lattice constant that is larger than the lattice constant of a material included in the second fin F2 or the substrate 101. Accordingly, the first and second isolation layers in the respective first and second recesses 141b, 2141b may have different lattice structures/constants, respectively.

In some embodiments, as described above, if the size of the first recess 141b is larger than the size of the second recess 2141b, the area of the first isolation layer that fills the first recess 141b may be larger than the area of the second isolation layer that fills the second recess 2141b. Further, the volume of the first isolation layer that fills the first recess 141b may be larger than the volume of the second isolation layer that fills the second recess 2141b.

Using the first isolation layer that fills the first recess 141b and the second isolation layer that fills the second recess 2141b, the carrier mobility of the channel region can be improved.

In some embodiments, each of the first isolation layer that fills the first recess 141b and the second isolation layer that fills the second recess 2141b may include FOX (Flowable Oxide), TOSZ (Tonen SilaZene), USG (Undoped Silicon/Silicate Glass), BSG (BoroSilicate Glass), PSG (Phospho-Silicate Glass), BPSG (BoroPhosphoSilicate Glass), PETEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), or a combination thereof, but is not limited thereto.

Referring to FIG. 14A, the first recess 141b that is formed in the first region I may have a first width w11 and a first depth d11. The second recess 2141b that is formed in the second region II may have a second width w22 and a second depth d22.

That is, the first recess 141b may have a first cross-sectional area that is defined by the first width w11 and the first width d11. Here, the first width w11 and the first depth d11 may be measured with respect to an upper surface of the first fin F1. That is, as illustrated, the first width w11 may correspond to the extending direction measured along the upper surface of the first fin F1, and the first depth d11 may correspond to the extending direction measured from the upper surface of the first fin F1 to the substrate 101.

Further, a second recess 2141b may have a second cross-sectional area that is defined by the second width w22 and the second depth d22. Here, the second width w22 and the second depth d22 may be measured with respect to an upper surface of the second fin F2. That is, as illustrated, the second width w22 may correspond to the extending direction measured along the upper surface of the second fin F2, and the second depth d22 may correspond to the extending direction measured from the upper surface of the second fin F2 to the substrate 2101.

Referring again to FIG. 14A, the first width w11 is larger than the second width w22, and the first depth d11 is larger than the second depth d22. That is, the first cross-sectional area that is defined by the first width w11 and the first depth d11 may be larger than the second cross-sectional area that is defined by the second width w22 and the second depth d22.

Figure 14B:
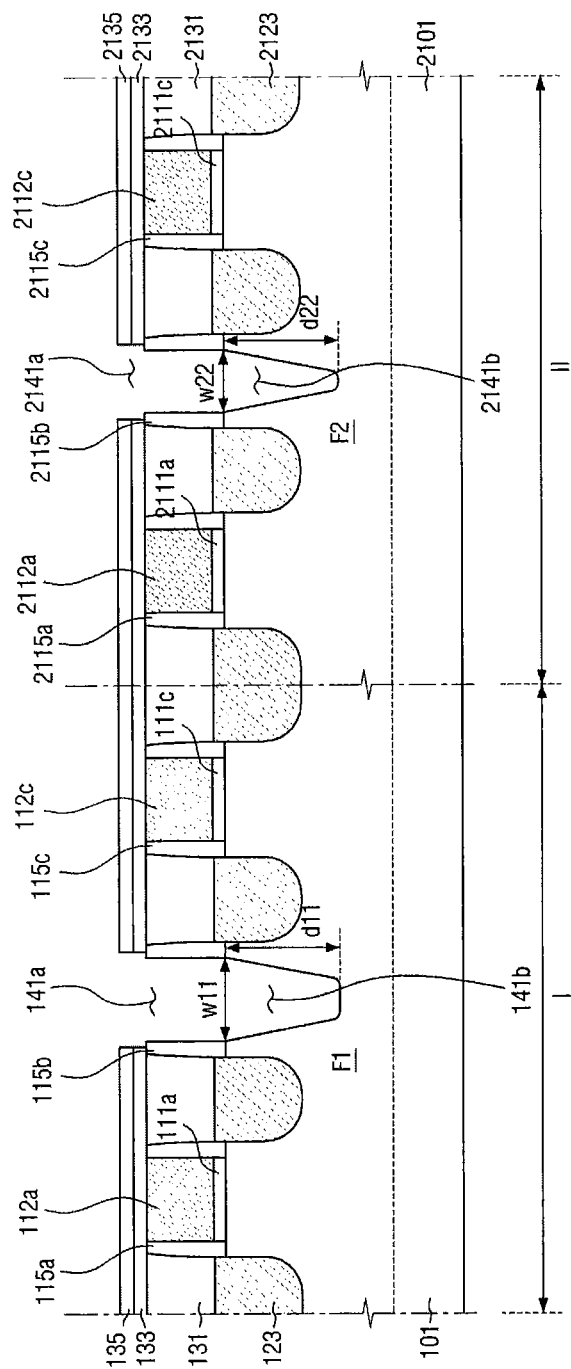

Referring to FIG. 14B, the first width w11 is larger than the second width w22, and the first depth d11 is equal to the second depth d22. That is, the first cross-sectional area that is defined by the first width w11 and the first depth d11 may be larger than the second cross-sectional area that is defined by the second width w22 and the second depth d22.

Figure 14C:
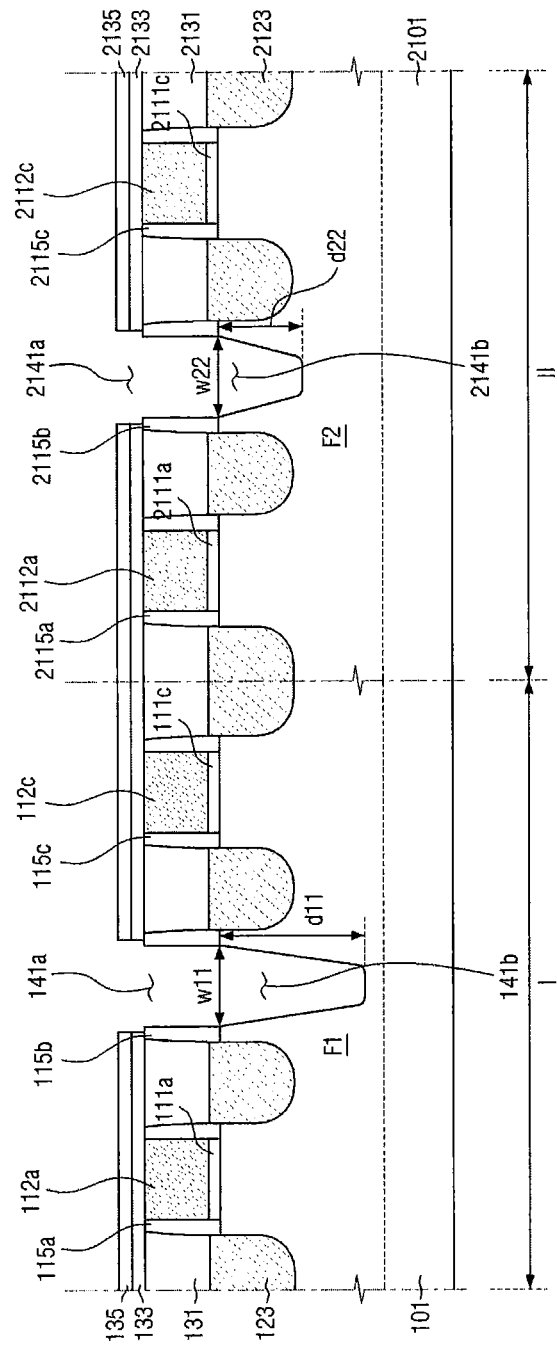

Referring to FIG. 14C, the first width w11 is equal to the second width w22, and the first depth d11 is larger than the second depth d22. That is, the first cross-sectional area that is defined by the first width w11 and the first depth d11 may be larger than the second cross-sectional area that is defined by the second width w22 and the second depth d22.

Referring to FIG. 14D, the first width w11 is smaller than the second width w22, and the first depth d11 is larger than the second depth d22. In this case, the first cross-sectional area that is defined by the first width w11 and the first depth d11 may be equal to or larger than the second cross-sectional area that is defined by the second width w22 and the second depth d22.

In various embodiments, as illustrated in FIGS. 14A to 14D, the first cross-sectional area that is defined by the first width w11 and the first depth d11 may be larger than the second cross-sectional area that is defined by the second width w22 and the second depth d22. Accordingly, in the case where an NMOS transistor is formed in the first region I and a PMOS transistor is formed in the second region II, the carrier mobility of each channel may be improved by applying a tensile stress to the NMOS transistor and applying a compression stress to the PMOS transistor.

The recesses may have various sizes in accordance with the kind/type (i.e., NMOS vs. PMOS) of semiconductor devices. Further, in the case where semiconductor devices arranged in different regions include recesses, the respective recesses may have different sizes.

Some descriptions herein (e.g., descriptions of subsequent processes) refer to a semiconductor device that includes the first recess 141b arranged in the first region I. However, the subsequent processes may also be applied to a semiconductor device that includes the second recess 2141b arranged in the second region II. That is, intermediate steps of a method for fabricating a semiconductor device to be described with reference to FIGS. 15 to 22 may be applied to the first region I and/or the second region II of FIGS. 14A to 14D.

Figure 15:
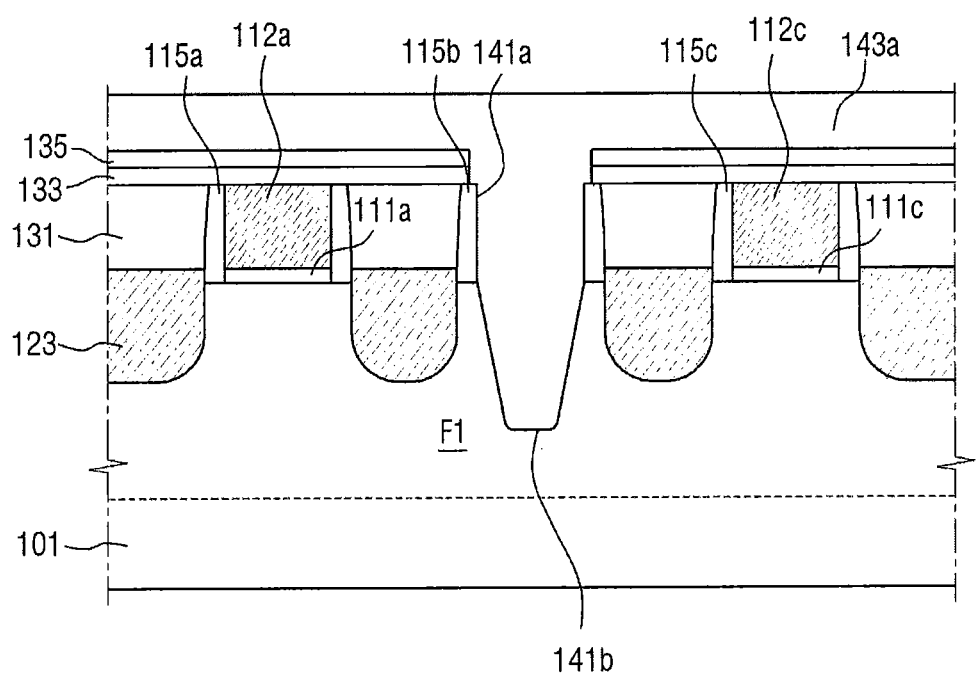

Referring to FIG. 15, the etch mask pattern 137a is removed, and a first isolation layer 143a that fills the first trench 141a and the first recess 141b is formed. The first isolation layer 143a may be, for example, an oxide layer, a nitride layer, or an oxynitride layer.

As described above regarding the "first isolation layer" that can be formed in a subsequent process for the structures that are in FIGS. 14A-14D, the first isolation layer 143a may include FOX (Flowable Oxide), TOSZ (Tonen SilaZene), USG (Undoped Silicon/Silicate Glass), BSG (Borosilicate Glass), PSG (PhosphoSilicate Glass), BPSG (BoroPhosphoSilicate Glass), PETEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), or a combination thereof.

Further, if the semiconductor device of FIG. 15 is an NMOS transistor, the first isolation layer 143a may include a tensile stress material, whereas if the semiconductor device is a PMOS transistor, the first isolation layer 143a may include a compression (e.g., compressive) stress material, but is not limited thereto.

Figure 16:
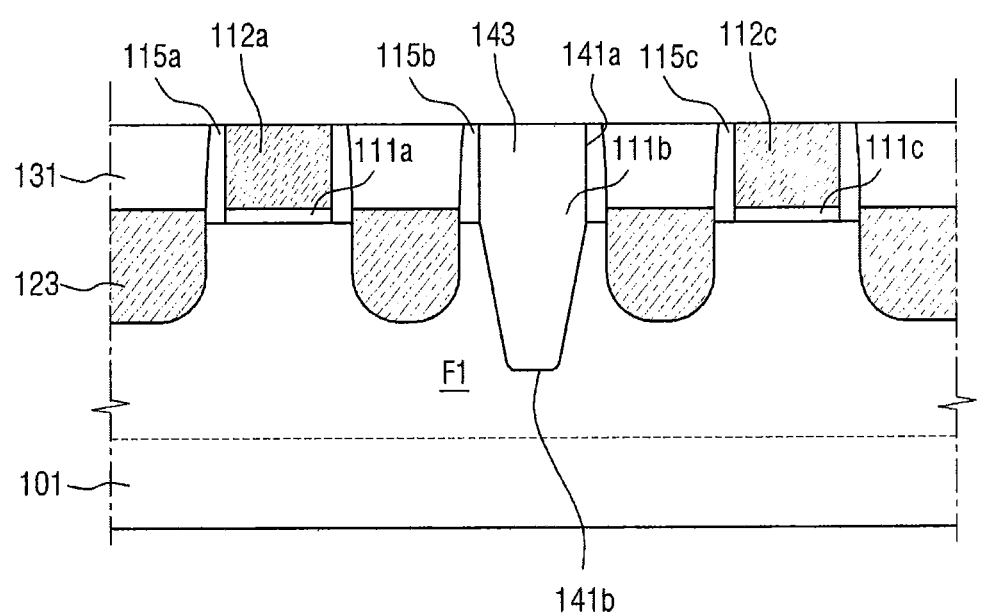

Referring to FIG. 16, the upper surfaces of the first and third sacrificial gate electrodes 112a and 112c are exposed through removal of upper portions of the first isolation layer 143a. In this case, the passivation layer 133 that covers the first and third sacrificial gate electrodes 112a and 112c and the first insulating layer 135 may be removed together through a planarization process. In FIG. 16, it is illustrated that the passivation layer 133 is entirely removed. However, the passivation layer 133 may partially remain only on the first interlayer insulating layer 131. The first isolation layer 143 remains only in the first trench 141a and the first recess 141b.

Figure 17:
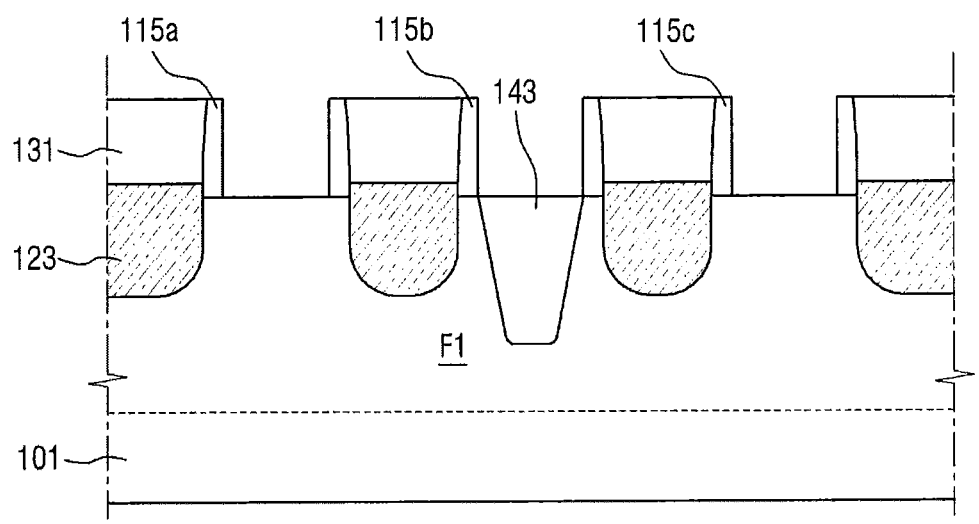

Referring to FIG. 17, the first and third sacrificial gate electrodes 112a and 112c and the first and third sacrificial gate insulating layers 111a and 111c are removed. In this case, a portion/part of the first isolation layer 143 may also be etched.

Although FIG. 17 illustrates that the first isolation layer 143 is positioned on the same plane as (e.g., coplanar with) the upper surfaces of the first to third fins F1 to F3, the present disclosure is not limited thereto. The upper surface of the first isolation layer 143 may be higher or lower than the upper surfaces of the first to third fins F1 to F3.

Figure 18:
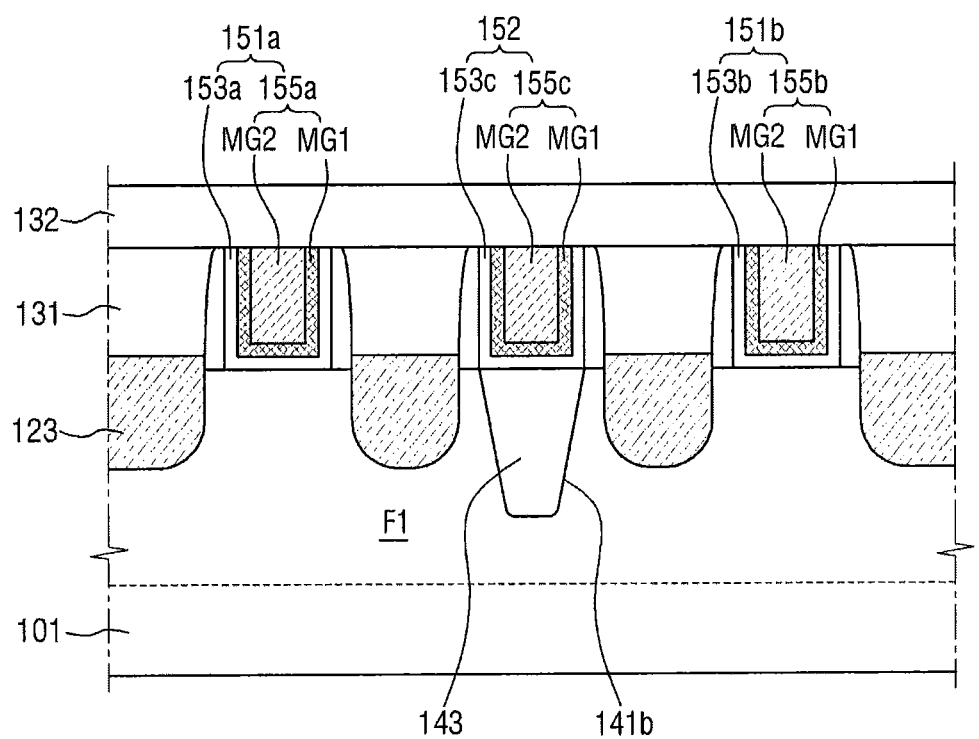

Referring to FIG. 18, the first and second gate structures 151a and 151b are formed on portions of the first to third fins F1 to F3 from which the first and third sacrificial gate electrodes 112a and 112c have been removed, a dummy gate structure 152 is formed on the first isolation layer 143. The first and second gate structures 151a and 151b and the dummy gate structure 152 may be simultaneously formed.

The first and second gate structures 151a and 151b may include first and second gate insulating layers 153a and 153b and first and second gate electrodes 155a and 155b.

The first and second gate insulating layers 153a and 153b may be respectively formed between the first to third fins F1 to F3 and the first and second gate electrodes 155a and 155b. The first and second gate insulating layers 153a and 153b may be respectively formed along the upper surfaces of the first to third fins F1 to F3 and a side wall of a first spacer 115. The first and second gate insulating layers 153a and 153b may include a high-k material having higher dielectric constant than the dielectric constant of a silicon oxide layer. For example, the first and second gate insulating layers 153a and 153b may include hafnium oxide ($HfO_2$), zirconium dioxide ($ZrO_2$), lanthanum oxide (LaO), aluminum oxide ($Al_2O_3$), or tantalum oxide ($Ta_2O_5$).

Each of the first and second gate electrodes 155a and 155b may include first and second metal layers MG1 and MG2. As illustrated, each of the first and second gate electrodes 155a and 155b may have two or more layers, i.e., the first and second metal layers MG1 and MG2, which are stacked on each other. The first metal layer MG1 serves to adjust a work function, and the second metal layer MG2 serves to fill a space that is formed by the first metal layer MG1. The first metal layer MG1 may be formed along the upper surfaces of the first to third fins F1 to F3 and a side wall of the spacer 115b. For example, the first metal layer MG1 may include at least one of titanium nitride (TiN), tantalum nitride (TaN), titanium carbide (TiC), titanium aluminum carbide (TiAlC), and tantalum carbide (TaC). Further, the second metal layer MG2 may include W or Al. Further, the first and second gate electrodes 155a and 155b may include Si or SiGe that is not a metal.

The dummy gate structure 152 may include a dummy gate insulating layer 153c and a dummy gate electrode 155c. Unlike the first and second gate structures 151a and 151b, the dummy gate structure 152 does not operate as a gate of a transistor.

The dummy gate insulating layer 153c may be formed between the first to third fins F1 to F3 and the dummy gate electrode 155c. The dummy gate insulating layer 153c may be formed on/along the upper surface of the first isolation layer 143 and the side wall of the spacer 115b. The dummy gate insulating layer 153c may include a high-k material having a higher dielectric constant than the dielectric constant of a silicon oxide layer. For example, the dummy gate insulating layer 153c may include $HfO_2$, $ZrO_2$, LaO, $Al_2O_3$, or $Ta_2O_5$.

The dummy gate electrode 155c may include first and second metal layers MG1 and MG2. The dummy gate electrode 155c may have two or more layers, i.e., the first and second metal layers MG1 and MG2, which are successively stacked on each other. For example, the first metal layer MG1 may include at least one of TiN, TaN, TiC, TiAlC, and TaC. Further, the second metal layer MG2 may include W or Al. Further, the dummy gate electrode 155c may include Si or SiGe that is not a metal.

Then, a second interlayer insulating layer 132 is formed. The second interlayer insulating layer 132 may cover the first interlayer insulating layer 131, the first and second gate structures 151a and 151b, and the dummy gate structure 152.

Referring to FIGS. 19 to 22, a silicide layer 161 is formed on the first to third source/drain regions 121, 123, and 125, and a contact 163 is formed on the silicide layer 161 to fabricate a semiconductor device 1.

Specifically, the silicide layer 161 may be formed along the upper surfaces of the first to third source/drain regions 121, 123, and 125. The silicide layer 161 may serve to reduce surface resistance and contact resistance when the first to third source/drain regions 121, 123, and 125 come in contact with the contact 163, and may include a conductive material, for example, platinum (Pt), nickel (Ni), or cobalt (Co). The contact 163 may be formed of a conductive material, and may include, for example, tungsten (W), aluminum (Al), or copper (Cu), but is not limited thereto.

Figure 23:
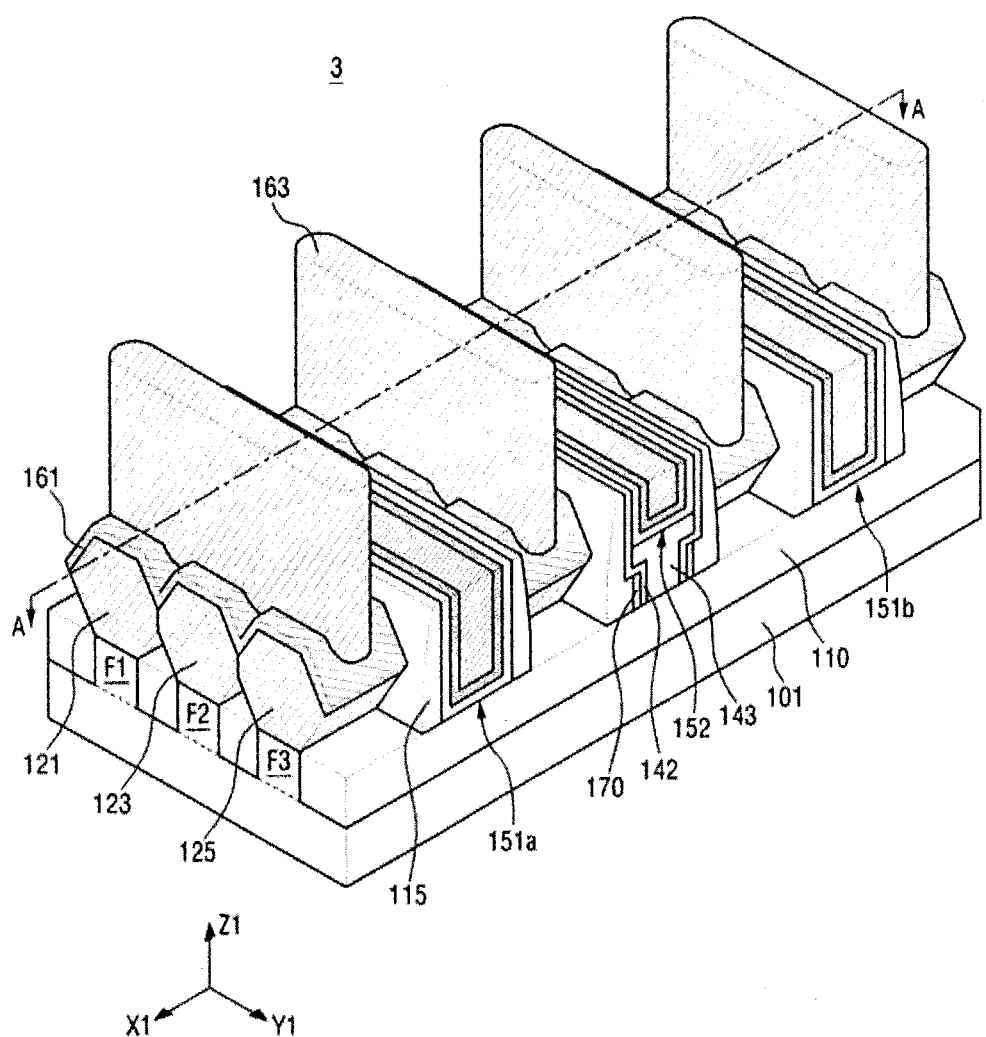
FIG. 23 is a perspective view of a semiconductor device according to some embodiments of the present disclosure.
Figure 24:
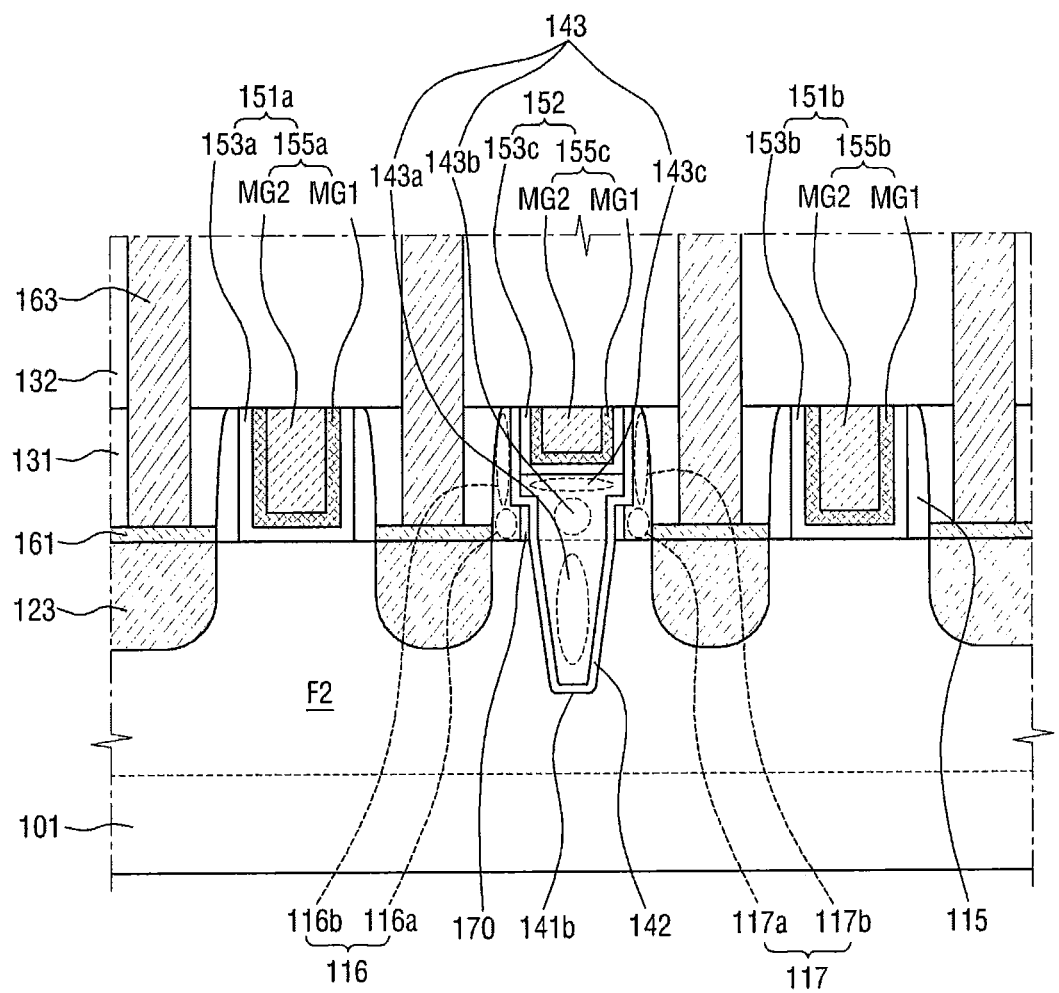
FIG. 24 is a cross-sectional view taken along line A-A of FIG. 23.

Referring to FIGS. 23 and 24, a semiconductor device according to some embodiments of the present disclosure will be described. Repeated descriptions of elements may be omitted, and explanation may focus on differences from FIGS. 1-22.

FIG. 23 is a perspective view of a semiconductor device according to some embodiments of the present disclosure, and FIG. 24 is a cross-sectional view taken along line A-A of FIG. 23. In FIG. 23, illustration of first and second interlayer insulating layers 131 and 132 is omitted.

A semiconductor device 3 illustrated in FIGS. 23 and 24 differs from the semiconductor device 1 as described above in shapes of the first isolation layer 143, the dummy gate structure 152, and the spacer 115, and further includes an inner spacer 170 and a capping layer 142.

The spacer 115 formed on side walls of the first and second gate structures 151a and 151b is the same as the spacer 115 of the semiconductor device 1 of FIG. 19, but the shapes of the spacers 116 and 117 that are formed on both side walls of the dummy gate structure 152 are different from those of the semiconductor device 1 of FIG. 19. Specifically, the spacer 116 that covers one side wall of the dummy gate structure 152 and the spacer 117 that covers the other side wall thereof are arranged on the first to third fins F1 to F3, but do not cover/overlap the first recess 141b. The spacers 116 and 117 respectively include first and second regions 116a and 116b and third and fourth regions 117a and 117b. The second region 116b is arranged on the first region 116a, and the fourth region 117b is arranged on the third region 117a. The width of the first region 116a is equal to or larger than the width of the second region 116b, and the width of the third region 117a is equal to or larger than the width of the fourth region 117a. Accordingly, the spacers 116 and 117 may be in an "L" shape to face each other. Here, the term "to face each other" means that the distance between the first region 116a and the third region 117a is shorter than the distance between the second region 116b and the fourth region 117b. If the spacers 116 and 117 do not face each other, the first and third regions 116a and 117a project in opposite directions. Accordingly, if the spacers 116 and 117 do not face each other, the distance between the first region 116a and the third region 117a is equal to the distance between the second region 116b and the fourth region 117b.

The inner spacer 170 is formed on inner walls of the spacers 116 and 117. Specifically, the inner spacer 170 is formed on side walls of the first region 116a and the third region 117a. The height of the inner spacer 170 may be equal to the height of the first and third regions 116a and 117a. The profile of the inner spacer 170 may be connected to the profile of the first recess 141b. The inner spacer 170 may include at least one of an oxide layer, a nitride layer, and an oxynitride layer.

The capping layer 142 may be formed between the first recess 141b and the first isolation layer 143. The capping layer 142 may be conformally formed along the inner surface of the first recess 141b. Further, the capping layer 142 may extend and may be conformally formed along the side walls of the spacers 116 and 117. The capping layer 142 may be arranged between the spacers 116 and 117 and the dummy gate structure 152. The capping layer 142 may include, for example, at least one of an oxide layer, a nitride layer, and an oxynitride layer.

The dummy gate structure 152 may be formed on the isolation layer 142. The lower surface of the dummy gate structure 152 may be higher than the lower surfaces of the first and second gate structures 151a and 151b. In other words, the upper surface of the first isolation layer 143 may be equal to or higher than the upper surfaces of the first to third fins F1 to F3.

If the lower surface of the dummy gate structure 152 is higher than the upper surfaces of the first and third regions 116a and 117a, the first isolation layer 143 may include fifth to seventh regions 143a, 143b, and 143c. Here, the fifth region 143a of the first isolation layer 143 is a region that fills the first recess 141b, the sixth region 143b is a region between the first and third regions 116a and 117a on the fifth region 143a, and the seventh region 143c is a region that reaches the lower surface of the dummy gate structure 152 on the sixth region 143b. The width of the seventh region 143c is equal to or larger than the width of the sixth region 143b. Accordingly, a portion/part of the first region 116a and a portion/part of the third region 117a may be arranged between the seventh region 143c and the first to third fins F1 to F3. Further, the first region 116b and the third region 117b may cover a portion/part of the lower surface of the dummy gate structure 152. In other words, a portion/part of the first region 116a and a portion/part of the third region 117a may be arranged between the first to third fins F1 to F3 and the dummy gate structure 152.

However, the present disclosure is not limited thereto, and the lower surface of the dummy gate structure 152 may come in contact with the inner spacer 170.

The remaining portions of the semiconductor device as illustrated in FIGS. 23 and 24 are the same as the corresponding remaining portions of the semiconductor device 1 of FIG. 1, and thus further explanation thereof may be omitted.

As described above, the semiconductor device 3 according to FIGS. 23 and 24 may be formed in the first region I and/or the second region II of FIGS. 14A to 14D.

Figure 25:
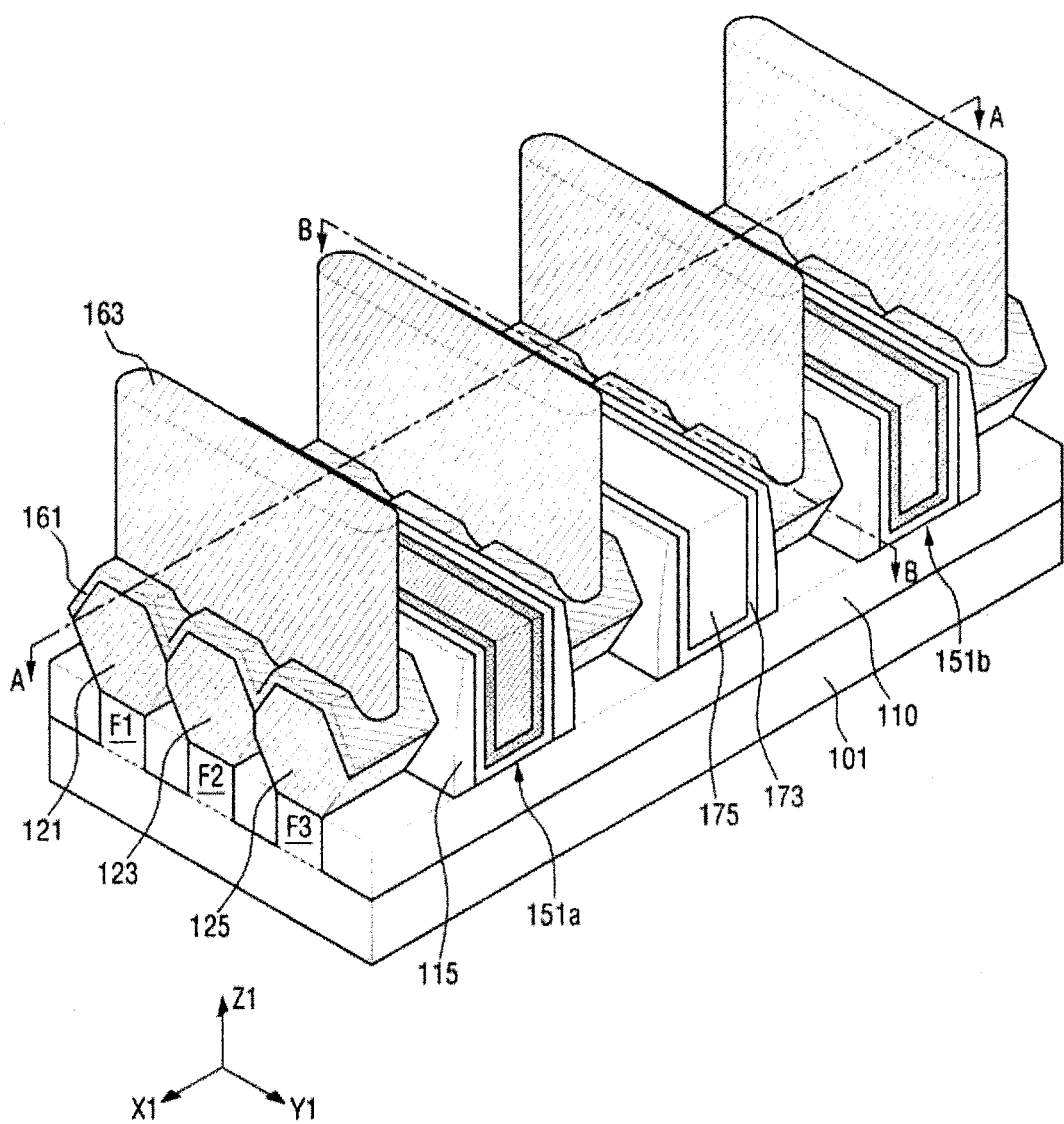
FIG. 25 is a perspective view of a semiconductor device according to some embodiments of the present disclosure.
Figure 26:
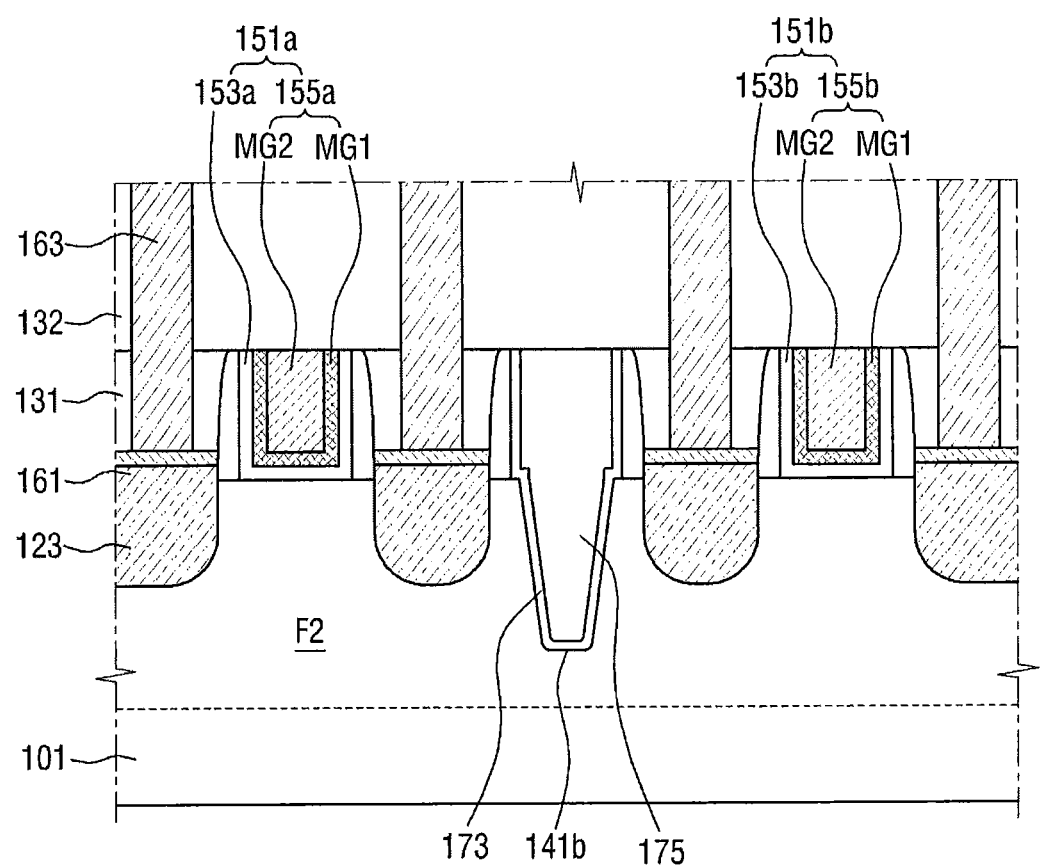
FIG. 26 is a cross-sectional view taken along line A-A of FIG. 25.
Figure 27:
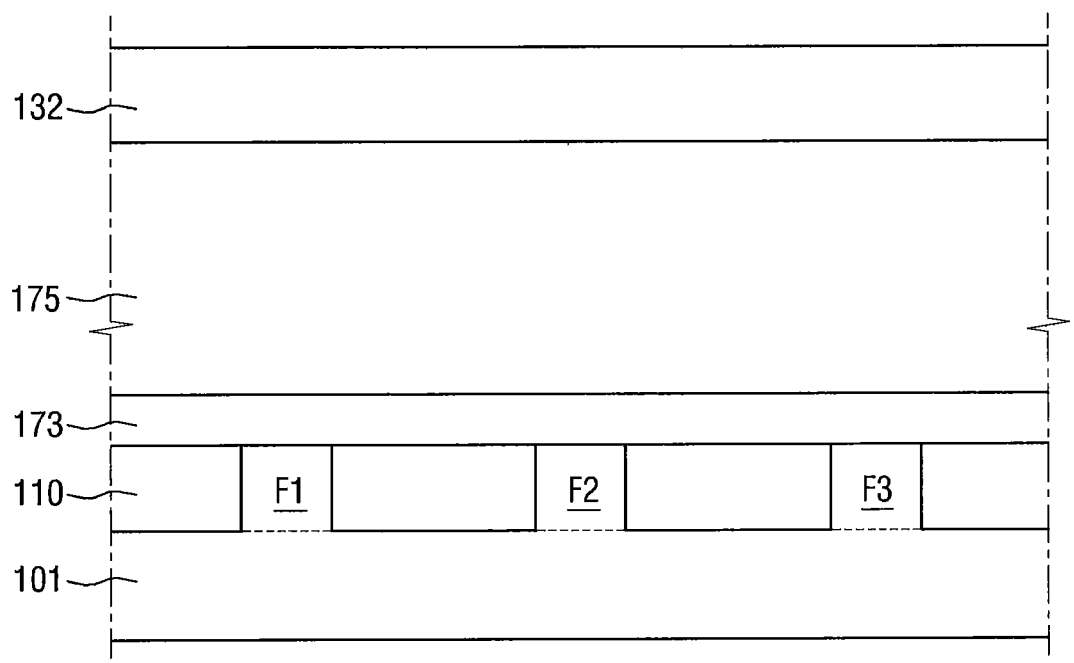
FIG. 27 is a cross-sectional view taken along line B-B of FIG. 25.

Referring to FIGS. 25 to 27, a semiconductor device according to some embodiments of the present disclosure will be described. Repeated descriptions of elements/features may be omitted, and explanation may focus on differences with respect to previously-discussed elements/features/structures.

FIG. 25 is a perspective view of a semiconductor device according to some embodiments of the present disclosure, FIG. 26 is a cross-sectional view taken along line A-A of FIG. 25, and FIG. 27 is a cross-sectional view taken along line B-B of FIG. 25. In FIG. 25, illustration of first and second interlayer insulating layers 131 and 132 is omitted.

Unlike the semiconductor device 1 of FIG. 19, the dummy gate structure 152 is not formed in the semiconductor device of FIG. 25. Instead, an isolation layer 175 may fill a portion otherwise corresponding to the dummy gate structure 152.

Specifically, referring to FIG. 25, the first recess 141b is formed in the first to third fins F1 to F3. The isolation layer 175 fills the first recess 141b. The spacer 115 is arranged on a side wall of the isolation layer 175 that projects from the first recess 141b. The spacer 115 is arranged on the first to third fins F1 to F3, but is not formed on/in the first recess 141b.

The isolation layer 175 may include, for example, at least one of silicon oxide, silicon nitride, silicon oxynitride, Hf oxide, La oxide, polysilicon, Ge, Ge oxide, Ti oxide, and W oxide.

A capping layer 173 is arranged between the first recess 141b and the isolation layer 175. The capping layer 173 may be conformally formed along the side wall of the first spacer 115, the upper surfaces of the first to third fins F1 to F3, and the inner surface of the first recess 141b. The capping layer 173 may be arranged on the first to third fins F1 to F3 and the field insulating layer 110.

The capping layer 173 may include, for example, at least one of silicon oxide, silicon nitride, silicon oxynitride, Hf oxide, La oxide, polysilicon, Ge, Ge oxide, Ti oxide, and W oxide.

In some embodiments, a second capping layer may be additionally formed between the capping layer 173 and the isolation layer 175. The profile of the first spacer 115 is not connected to the profile of the first recess 141b.

Figure 38:
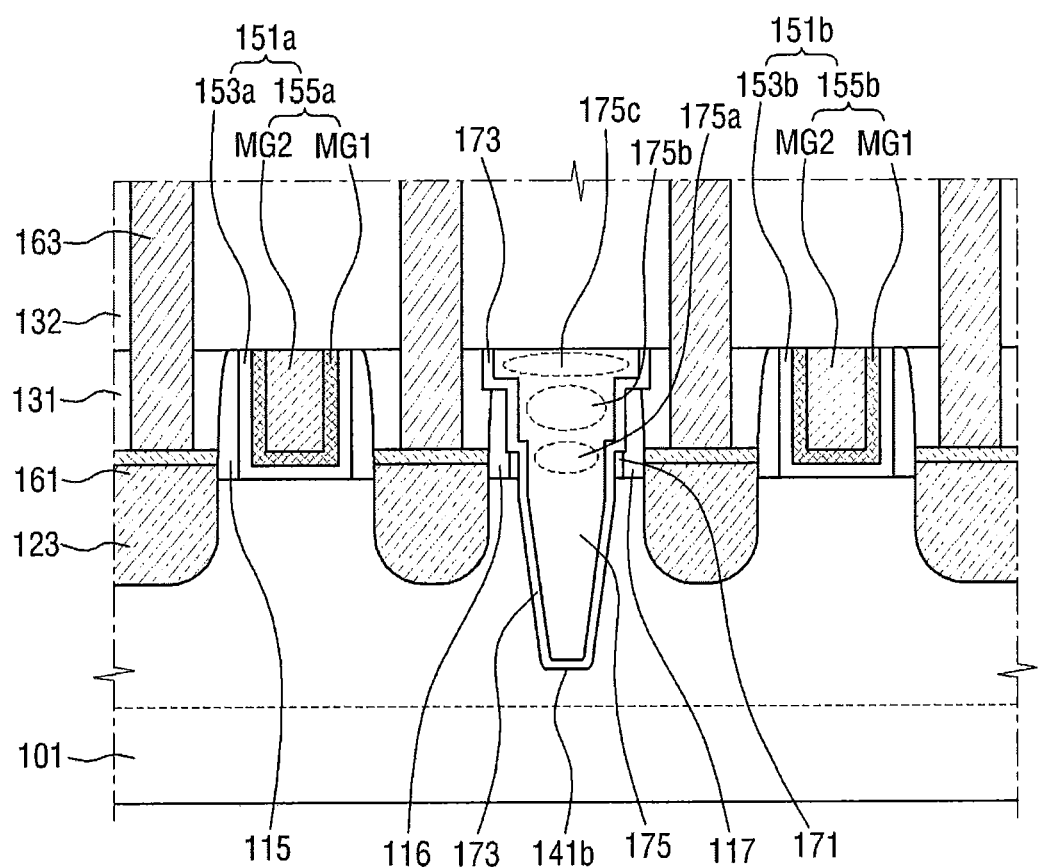
FIG. 38 is a cross-sectional view taken along line A-A of FIG. 37.

The isolation layer 175 includes a first region 175a (e.g., as illustrated in FIG. 38) that is provided in the first recess 141b and a second region 175b (e.g., as illustrated in FIG. 38) that is provided on the first recess 141b. The width of the first region 175a may be smaller than the width of the second region 175b. The upper surface of the isolation layer 175 and the upper surfaces of the first and second gate structures 151a and 151b may be positioned on the same plane (e.g., may be coplanar).

In some embodiments, as described above, the semiconductor device according to FIGS. 25-27 may be formed in the first region I and/or the second region II of FIGS. 14A to 14D.

Figure 28:
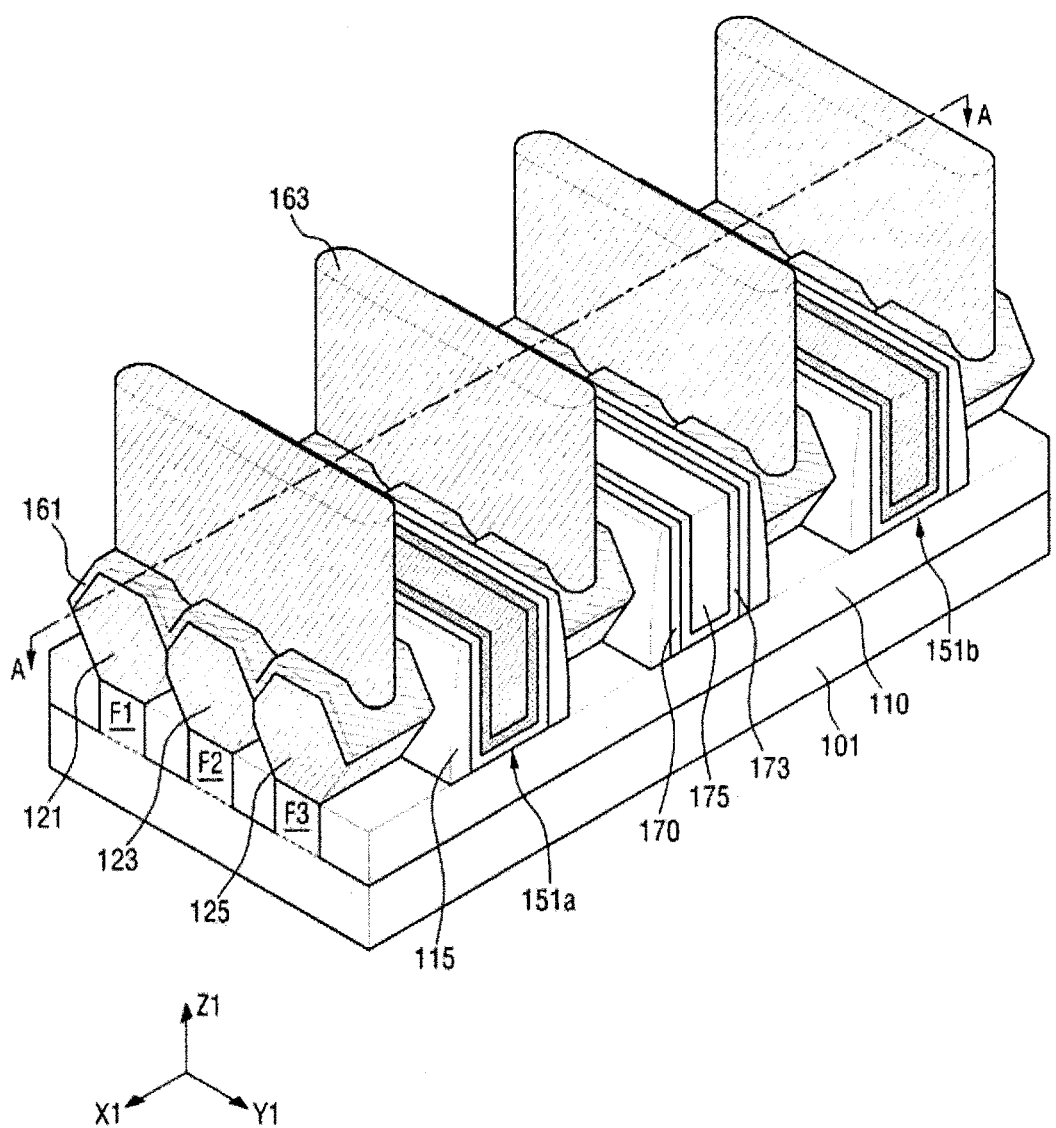
FIG. 28 is a perspective view of a semiconductor device according to some embodiments of the present disclosure.
Figure 29:
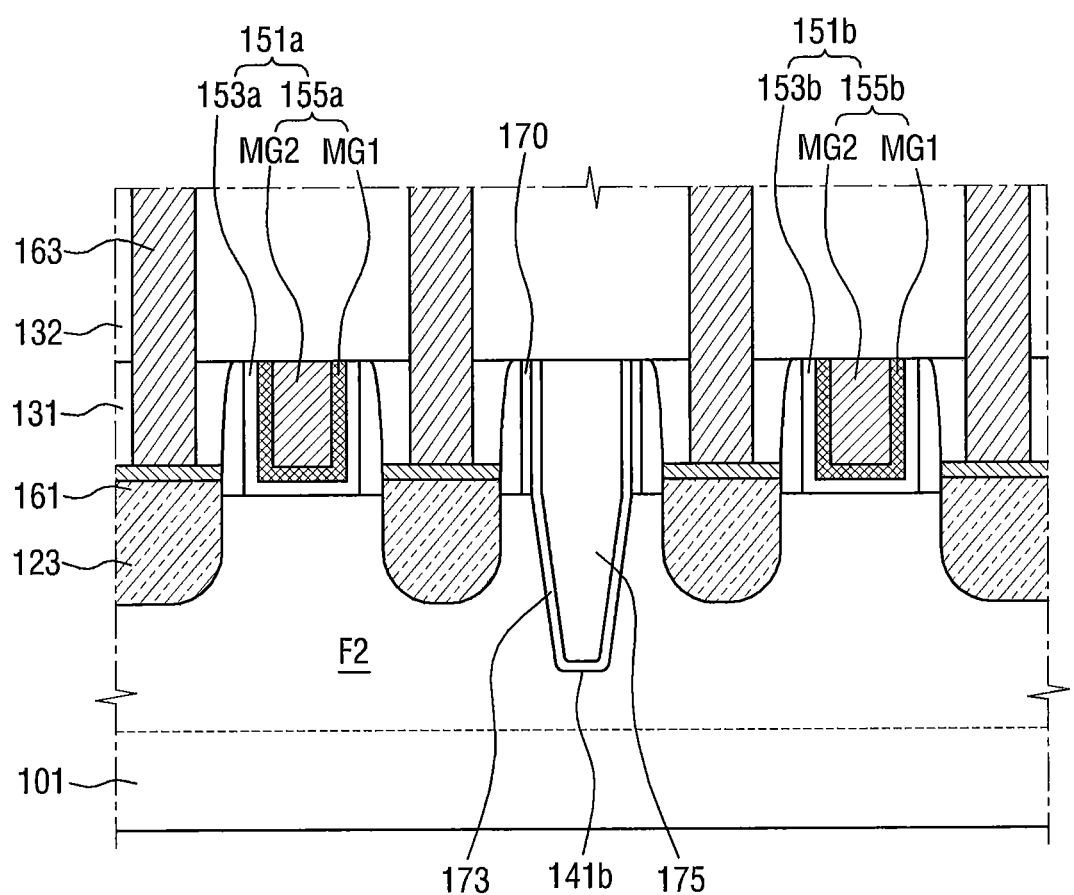
FIG. 29 is a cross-sectional view taken along line A-A of FIG. 28.

Referring to FIGS. 28 and 29, a semiconductor device according to some embodiments of the present disclosure will be described. Repeated descriptions may be omitted, and explanation may focus on differences with respect to previously-discussed elements/features/structures.

FIG. 28 is a perspective view of a semiconductor device according to some embodiments of the present disclosure, and FIG. 29 is a cross-sectional view taken along line A-A of FIG. 29. In FIG. 28, illustration of first and second interlayer insulating layers 131 and 132 is omitted.

Referring to FIGS. 28 and 29, unlike the semiconductor device of FIG. 25, a semiconductor device of FIG. 28 further includes an inner spacer 170. The inner spacer 170 may be arranged between the isolation layer 175 and the first spacer 115. Specifically, the inner spacer 170 is formed on the side wall of the first spacer 115. The profile of the inner spacer 170 may be connected to (e.g., continuous with) the profile of the first recess 141b. The capping layer 173 may be conformally formed along the inner surfaces of the inner spacer 170 and the first recess 141b, and the isolation layer 175 may be formed on the capping layer 173. The upper surface of the isolation layer 175 may be positioned on the same plane as (i.e., coplanar with) the upper surfaces of the first and second gate structures 151a and 151b. The height of the first spacer 115 may be equal to the height of the inner spacer 170.

In some embodiments, as described above, the semiconductor device according to FIGS. 28 and 29 may be formed in the first region I and/or the second region II of FIGS. 14A to 14D.

Figure 30:
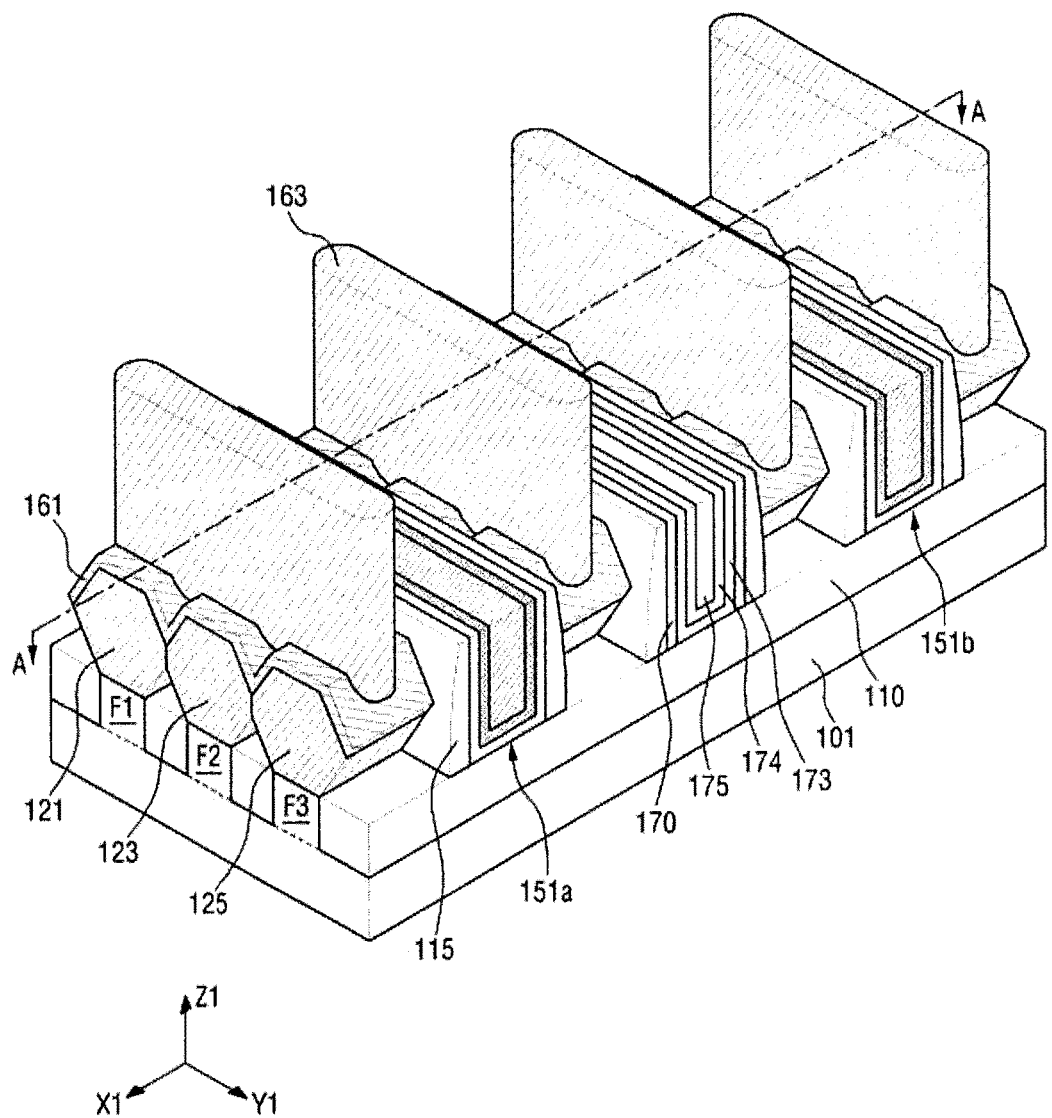
FIG. 30 is a perspective view of a semiconductor device according to some embodiments of the present disclosure.
Figure 31:
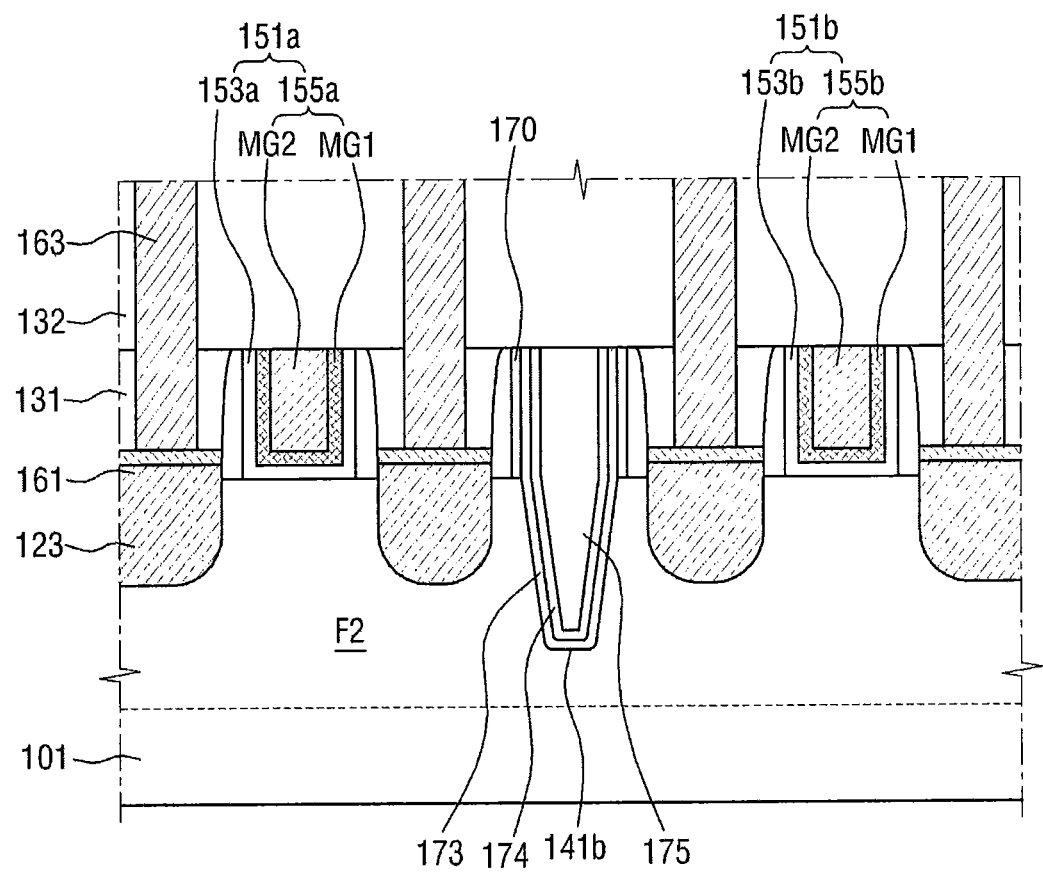
FIG. 31 is a cross-sectional view taken along line A-A of FIG. 30.

Referring to FIGS. 30 and 31, a semiconductor device according to some embodiments of the present disclosure will be described. Repeated descriptions may be omitted, and explanation may focus on differences with respect to previously-discussed features/elements/structures.

FIG. 30 is a perspective view of a semiconductor device according to some embodiments of the present disclosure, and FIG. 31 is a cross-sectional view taken along line A-A of FIG. 3Q. In FIG. 30, illustration of first and second interlayer insulating layers 131 and 132 is omitted.

The semiconductor device of FIG. 30 may further include a second capping layer 174 in comparison to the semiconductor device of FIG. 28. The second capping layer 174 may be formed between the capping layer 173 and the isolation layer 175, and may be conformally formed along the inner surfaces of the inner spacer 170 and the first recess 141b.

The second capping layer 174 may include, for example, at least one of silicon oxide, silicon nitride, silicon oxynitride, Hf oxide, La oxide, polysilicon, Ge, Ge oxide, Ti oxide, and W oxide.

In some embodiments, as described above, the semiconductor device according to FIGS. 30 and 31 may be formed in the first region I and/or the second region II of FIGS. 14A to 14D.

Figure 32:
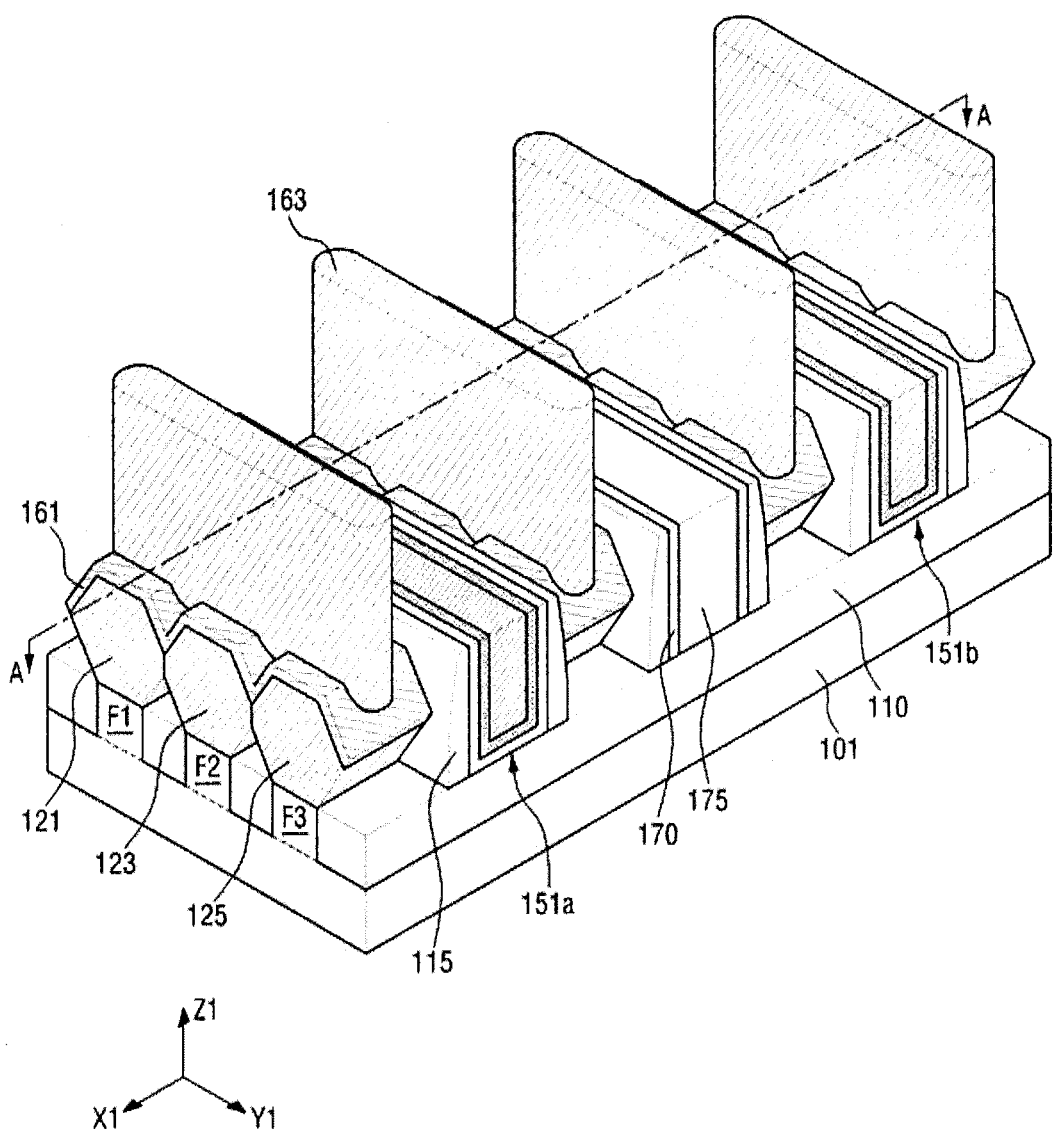
FIG. 32 is a perspective view of a semiconductor device according to some embodiments of the present disclosure.
Figure 33:
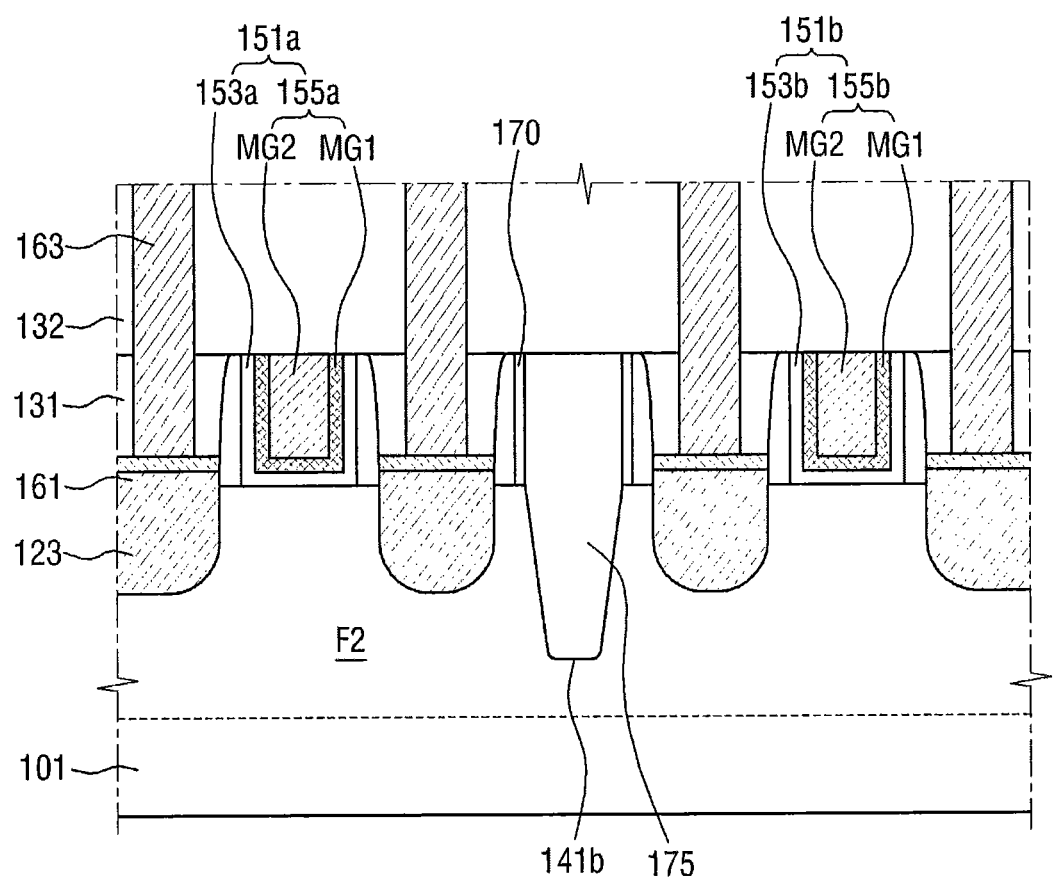
FIG. 33 is a cross-sectional view taken along line A-A of FIG. 32.

Referring to FIGS. 32 and 33, a semiconductor device according to some embodiments of the present disclosure will be described. Repeated descriptions may be omitted, and explanation may focus on differences with respect to previously-discussed features/elements/structures.

FIG. 32 is a perspective view of a semiconductor device according to some embodiments of the present disclosure, and FIG. 33 is a cross-sectional view taken along line A-A of FIG. 32. In FIG. 32, illustration of first and second interlayer insulating layers 131 and 132 is omitted.

Unlike the semiconductor device of FIG. 28, the capping layer 173 is not formed in a semiconductor device of FIG. 32. The isolation layer 175 may directly fill the first recess 141*b*.

The upper surface of the isolation layer 175 and the upper surfaces of the first and second gate structures 151*a* and 151*b* may be positioned on the same plane (i.e., may be coplanar).

In some embodiments, as described above, the semiconductor device according to FIGS. 32 and 33 may be formed in the first region I and/or the second region II of FIGS. 14A to 14D.

Figure 34:
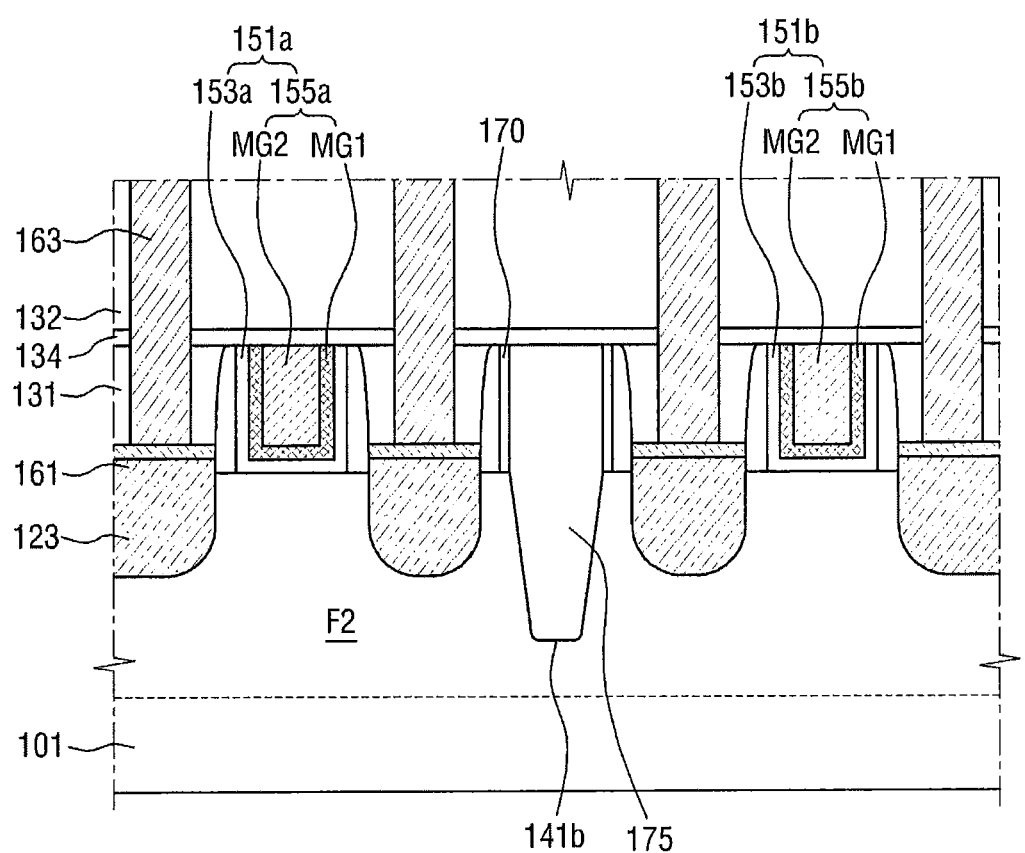
FIG. 34 is a cross-sectional view of a semiconductor device according to some embodiments of the present disclosure.

Referring to FIG. 34, a semiconductor device according to some embodiments of the present disclosure will be described.

A semiconductor device according to FIG. 34 is substantially the same as the semiconductor device as described above with reference to FIGS. 32 and 33 except that the semiconductor device according to FIG. 34 further includes an interlayer capping layer formed between the first interlayer insulating layer 131 and the second interlayer insulating layer 132. Accordingly, repeated descriptions may be omitted, and explanation may focus on differences with respect to previously-discussed features/elements/structures.

FIG. 34 is a cross-sectional view of a semiconductor device according to some embodiments of the present disclosure.

Referring to FIG. 34, an interlayer capping layer 134 is arranged between the first interlayer insulating layer 131 and the second interlayer insulating layer 132.

The interlayer capping layer 134 may be formed on the first interlayer insulating layer 131, the first and second gate structures 151*a* and 151*b*, and the isolation layer 175. That is, the interlayer capping layer 134 may be formed on the upper surface of the first interlayer insulating layer 131, the upper surfaces of the first and second gate structures 151*a* and 151*b*, and the upper surface of the isolation layer 175.

Accordingly, the interlayer capping layer 134 may extend along the upper surface of the first interlayer insulating layer 131, the upper surfaces of the first and second gate structures 151*a* and 151*b*, and the upper surface of the isolation layer 175.

The interlayer capping layer 134 may come in contact with the first and second gate structures 151*a* and 151*b*. The interlayer capping layer 134 may come in contact with the first interlayer insulating layer 131. Further, the interlayer capping layer 134 may come in contact with the isolation layer 175.

The interlayer capping layer 134 may include a material that is different from the material of the first interlayer insulating layer 131. The interlayer capping layer 134 may include, for example, silicon nitride.

Further, in a semiconductor device according to some embodiments of the present disclosure, the thickness of the interlayer capping layer 134 may be equal to or larger than 3 Å and equal to or smaller than 60 Å.

The second interlayer insulating layer 132 may be formed on the interlayer capping layer 134. For example, the second interlayer insulating layer 132 may come in contact with the interlayer capping layer 134.

The second interlayer insulating layer 132 may include a material that is different from the material of the interlayer capping layer 134. The interlayer capping layer 134 may include a material having an etch selectivity with respect to the second interlayer insulating layer 132.

The interlayer capping layer 134 may impede/prevent oxygen from being drawn into the first and second gate structures 151*a* and 151*b*. That is, the second interlayer insulating layer 132 that is formed on the interlayer capping layer 134 may include an oxide.

During the process of fabricating a semiconductor device, oxygen may be diffused from the second interlayer insulating layer 132 that includes the oxide into the first and second gate structures 151*a* and 151*b*. In the case where the oxygen is drawn into the first and second gate structures 151*a* and 151*b*, threshold voltages of the first and second gate structures 151*a* and 151*b* may be changed.

However, since the interlayer capping layer 134 that is a silicon nitride layer is interposed between the first and second gate structures 151*a* and 151*b* and the second interlayer insulating layer 132, the interlayer capping layer 134 can impede/prevent oxygen from being diffused from the second interlayer insulating layer 132 to the first and second gate structures 151*a* and 151*b*.

Through this, the threshold voltages of the first and second gate structures 151*a* and 151*b* may not be changed.

In some embodiments, the interlayer capping layer 134 as described above may be applied to any of the semiconductor devices in FIGS. 1-38, and is not limited to the semiconductor device according to FIG. 34.

Figure 35:
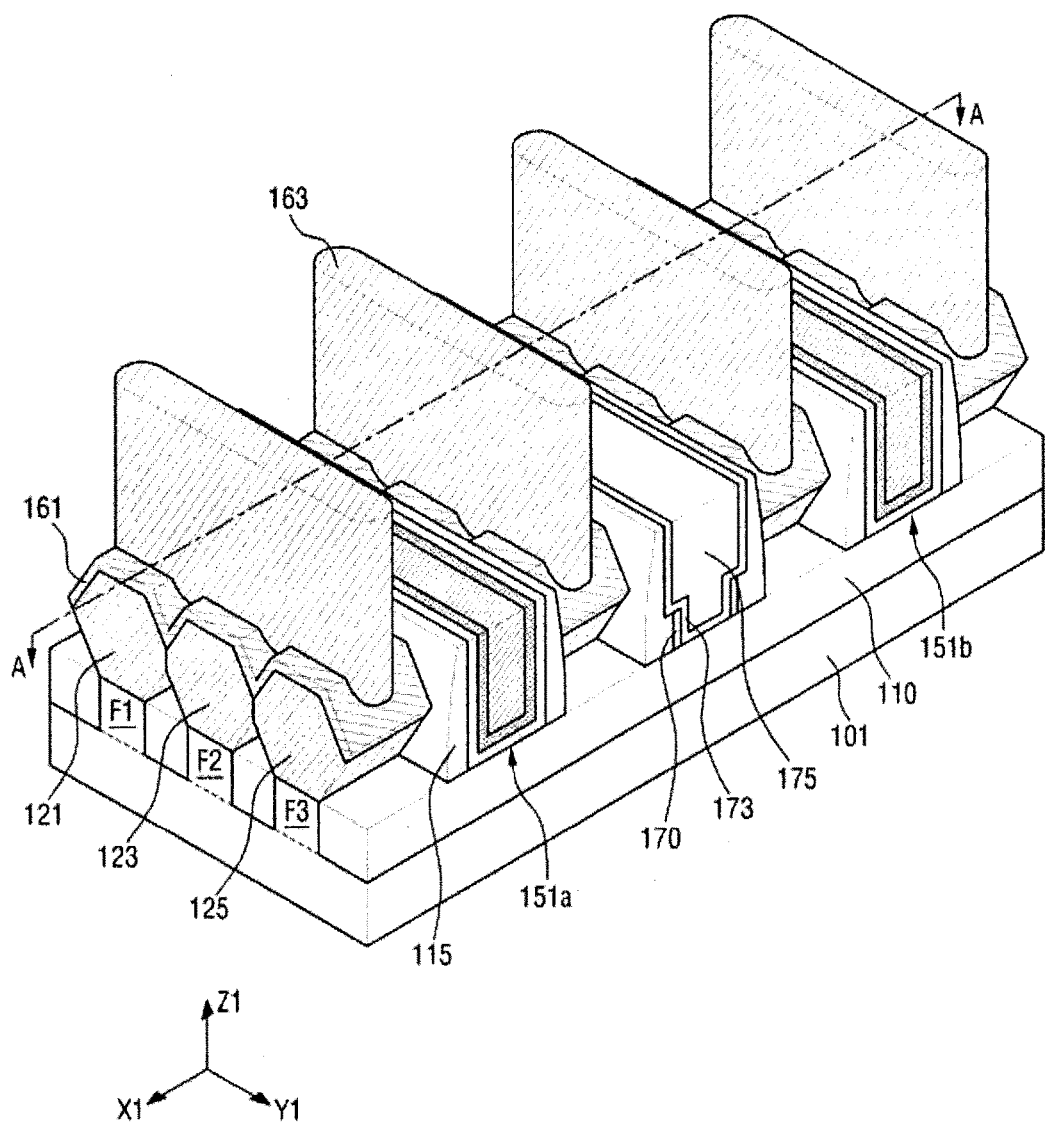
FIG. 35 is a cross-sectional view of a semiconductor device according to some embodiments of the present disclosure.
Figure 36:
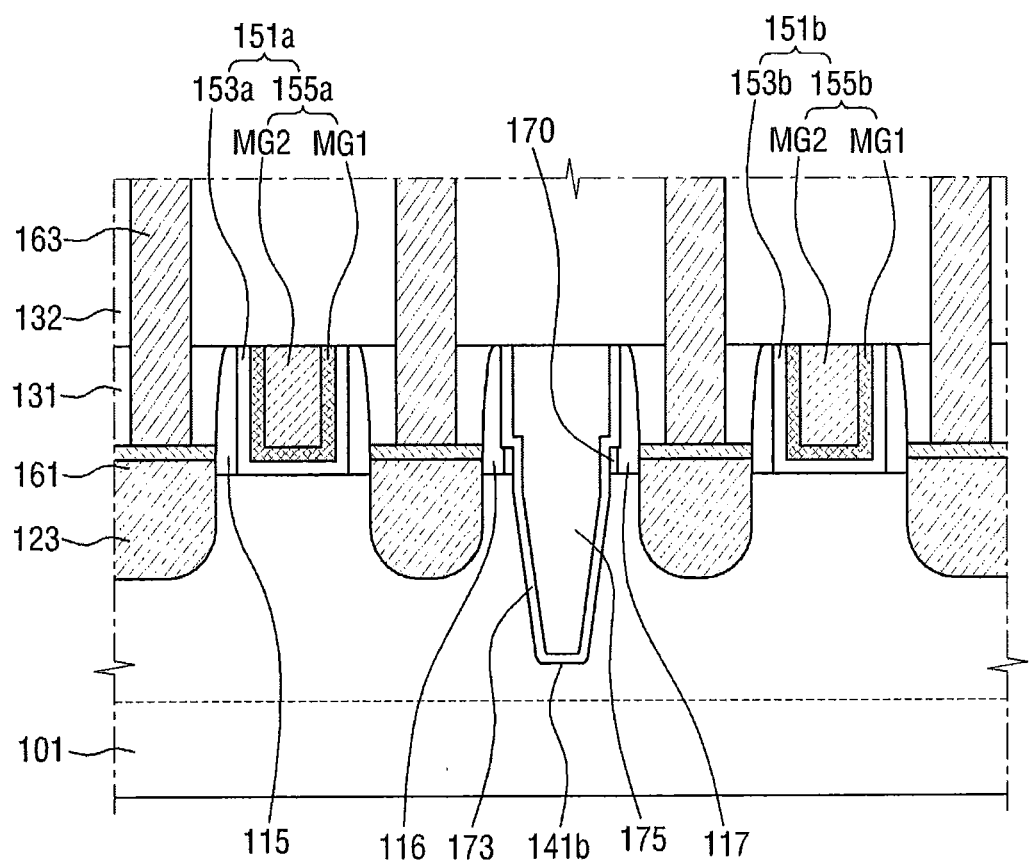
FIG. 36 is a cross-sectional view taken along line A-A of FIG. 35.

Referring to FIGS. 35 and 36, a semiconductor device according to some embodiments of the present disclosure will be described. Repeated descriptions may be omitted, and explanation may focus on differences with respect to previously-discussed features/elements/structures.

FIG. 35 is a perspective view of a semiconductor device according to some embodiments of the present disclosure, and FIG. 36 is a cross-sectional view taken along line A-A of FIG. 35. In FIG. 35, illustration of first and second interlayer insulating layers 131 and 132 is omitted.

According to a semiconductor device of FIG. 35, the dummy gate structure 152 is removed from the semiconductor device of FIG. 23. An inner spacer 170 and a capping layer 173 of FIG. 35 correspond to the inner spacer 170 and the capping layer 142 of FIG. 23. Since the isolation layer 175 fills the portion in which the dummy gate structure 152 is positioned as shown in FIG. 23, the upper surface of the isolation layer 175 is positioned on the same plane as (i.e., coplanar with) the upper surfaces of the first and second gate structures 151*a* and 151*b* as shown in FIGS. 35 and 36.

The shapes of the spacers 116 and 117 and the inner spacer 170 on both sides of the isolation layer 175 in FIGS. 35 and 36 are the same as the shapes of the spacers 116 and 117 and the inner spacer 170 on both sides of the dummy gate structure 152 in FIGS. 23 and 24. Accordingly, the height of the inner spacer 170 may be smaller than the height of each of the spacers 116 and 117, and each of the spacers 116 and 117 may have an "L" shape. Further, the widths of the upper portion and the lower portion of each of the spacers 116 and 117 that is arranged on the side wall of the isolation layer 175 may differ from each other, and the widths of the upper portion and the lower portion of the isolation layer 175 that is positioned on the first recess 141*b* may also differ from each other. Since these features have already been described, detailed explanations thereof may be omitted.

Figure 37:
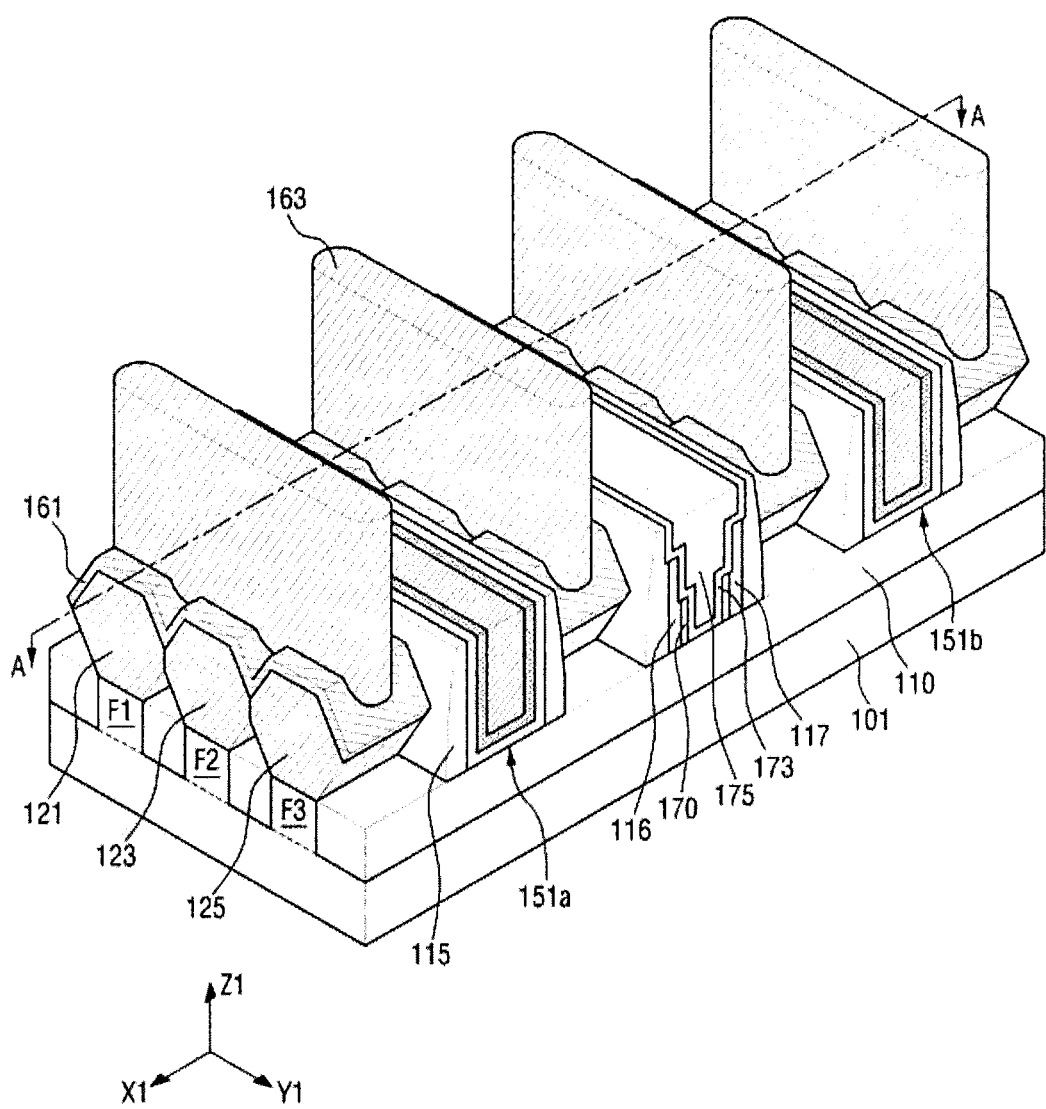
FIG. 37 is a cross-sectional view of a semiconductor device according to some embodiments of the present disclosure.

Referring to FIGS. 37 and 38, a semiconductor device according to some embodiments of the present disclosure will be described. Repeated descriptions may be omitted, and explanation may focus on differences with respect to previously-discussed features/elements/structures.

FIG. 37 is a perspective view of a semiconductor device according to some embodiments of the present disclosure, and FIG. 38 is a cross-sectional view taken along line A-A of FIG. 37. In FIG. 37, illustration of first and second interlayer insulating layers 131 and 132 is omitted.

According to a semiconductor device of FIG. 37, unlike the semiconductor device of FIG. 35, the isolation layer 175 may fill/overlap the upper surfaces of the spacers 116 and 117 that are arranged on both side walls of the isolation layer 175. Accordingly, the height of the spacers 116 and 117 on both side walls of the isolation layer 175 may be smaller than the height of the spacers 115 on both side walls of the first and second gate structures 151a and 151b.

The isolation layer 175 may include first to third regions 175a, 175b, and 175c on the first recess 141b. The first region 175a is arranged between the inner spacers 170, the second region 175b is arranged on the first region 175a, and the third region 175c is arranged on the second region 175b. The width of the third region 175c may be larger than the width of the second region 175b, and the width of the second region 175b may be larger than the width of the first region 175a.

The capping layer 173 may be formed along the side wall of the first interlayer insulating layer 131, the upper surface and the side wall of the spacers 116 and 117, the upper surface and the side wall of the inner spacer 170, and the side wall of the first recess 141b. The capping layer 173 may be in the shape of steps.

In some embodiments, on the spacers 116 and 117, the isolation layer 175 may extend in the first direction X1 to come in contact with the contact 163. Even though the capping layer 173 and the isolation layer 175 come in contact with each other, the capping layer 173 and the isolation layer 175 are not conductors and/or semiconductors, and thus do not exert an influence on the semiconductor device.

As described above, the semiconductor device according to FIGS. 37 and 38 may be formed in the first region I and/or the second region II of FIGS. 14A to 14D.

In a semiconductor device according to some embodiments of the present disclosure, a void may be formed in the first recess 141b. Further, in the semiconductor device according to some embodiments of the present disclosure, a void may be formed in the isolation layers 143 and 175. Even if the void is formed, it does not exert an influence on the operation of the semiconductor device according to some embodiments of the present disclosure.

Figure 39:
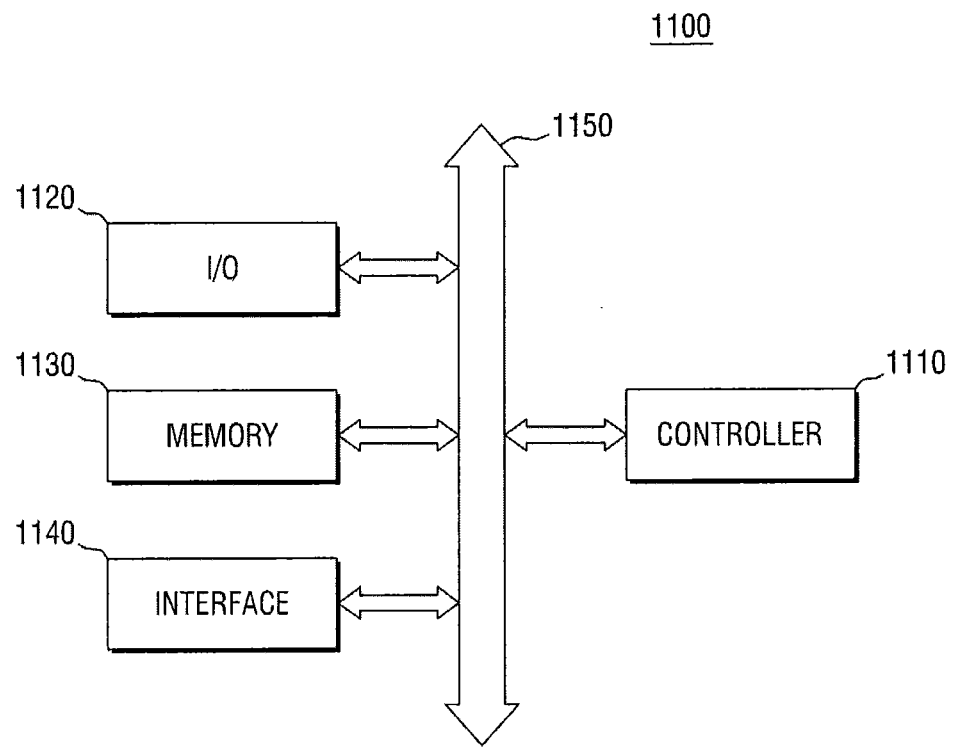
FIG. 39 is a block diagram of an electronic system including a semiconductor device according to some embodiments of the present disclosure.

FIG. 39 is a block diagram of an electronic system including a semiconductor device according to some embodiments of the present disclosure.

Referring to FIG. 39, an electronic system 1100 according to some embodiments of the present disclosure may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. The electronic system 1100 may further include a high-speed DRAM and/or SRAM as an operating memory for improving the operation of the controller 1110. Each of the semiconductor devices according to some embodiments of the present disclosure may be provided in the memory 1130 or may be provided as a part of the controller 1110 and the I/O device 1120.

The electronic system 1100 may be applied to a PDA (Personal Digital Assistant), a portable computer, a web tablet, a wireless phone, a mobile phone, a digital music player, a memory card, or any electronic device that can transmit and/or receive information in wireless environments.

Figure 40:
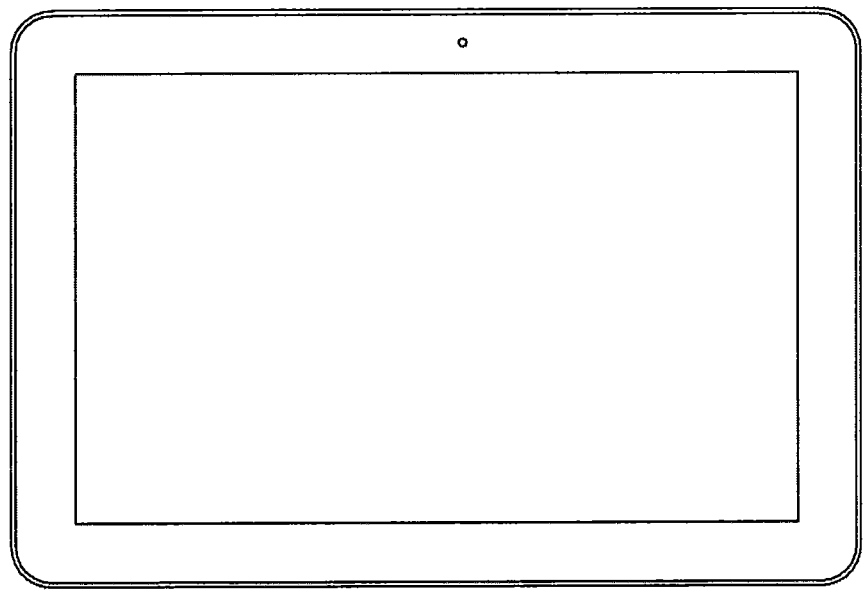
FIG. 40 is a view illustrating an example of a semiconductor system to which the semiconductor devices according to some embodiments of the present disclosure can be applied.

FIG. 40 is a view illustrating an example of a semiconductor system to which the semiconductor devices according to some embodiments of the present disclosure can be applied. FIG. 40 illustrates a tablet computer (e.g., a tablet personal computer (PC)). The semiconductor devices according to some embodiments of the present disclosure may be used in a tablet computer or a laptop computer (e.g., a laptop PC). It will be understood by those skilled in the art that the semiconductor devices according to some embodiments of the present disclosure can be applied even to other integrated circuit devices that have not been explicitly discussed herein.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
    a first substrate region and a second substrate region;
    a first fin protruding from the first substrate region and comprising a first recess;
    a first isolation layer in the first recess;
    a first source/drain region on the first fin adjacent the first recess;
    a second fin protruding from the second substrate region and comprising a second recess;
    a second isolation layer in the second recess; and
    a second source/drain region on the second fin adjacent the second recess,
    wherein a bottom surface of the first recess is lower than a bottom surface of the second recess,
    wherein an upper surface of the first isolation layer is coplanar with, or protrudes beyond, an upper surface of the first fin, and
    wherein an upper surface of the second isolation layer is coplanar with, or protrudes beyond, an upper surface of the second fin.

2. The semiconductor device of claim 1, further comprising:
    a third source/drain region on the first fin adjacent the first recess, wherein the first recess is between the first source/drain region and the third source/drain region; and
    a fourth source/drain region on the second fin adjacent the second recess, wherein the second recess is between the second source/drain region and the fourth source/drain region.

3. The semiconductor device of claim 1, wherein a widest first width of the first recess is wider than a widest second width of the second recess.

4. The semiconductor device of claim 1, wherein the first and second isolation layers comprise different respective lattice structures.

5. The semiconductor device of claim 4,
wherein a lattice constant of the first isolation layer is equal to or smaller than a lattice constant of the first fin or the first substrate region, and
wherein a lattice constant of the second isolation layer is larger than a lattice constant of the second fin or the second substrate region.

6. The semiconductor device of claim 1,
wherein a cross-sectional area of the first recess is larger than a cross-sectional area of the second recess.

7. The semiconductor device of claim 1, further comprising first and second spacers on the first fin, wherein the first isolation layer protrudes from the first recess to extend between the first and second spacers.

8. The semiconductor device of claim 1,
wherein the bottom surface of the first recess is lower than a bottom surface of the first source/drain region, and
wherein the bottom surface of the second recess is lower than a bottom surface of the second source/drain region.

9. The semiconductor device of claim 1,
wherein a lattice constant of the first source/drain region is equal to or smaller than a lattice constant of the first substrate region, and
wherein a lattice constant of the second source/drain region is larger than a lattice constant of the second substrate region.

10. A semiconductor device comprising:
a first substrate region and a second substrate region;
a first fin protruding from the first substrate region and comprising a first recess;
a gate structure that extends across the first fin and is spaced apart from the first recess;
a first isolation layer in the first recess;
a dummy gate structure on the first isolation layer;
a first source/drain region in the first fin between the gate structure and the dummy gate structure;
a second fin protruding from the second substrate region and comprising a second recess;
a second isolation layer in the second recess; and
a second source/drain region in the second fin adjacent the second recess,
wherein the first recess comprises a first depth that is deeper than a second depth of the first source/drain region in the first fin,
wherein the second recess comprises a third depth that is deeper than a fourth depth of the second source/drain region in the second fin,
wherein the first depth of the first recess is defined with respect to an upper surface of the first fin,
wherein the third depth of the second recess is defined with respect to an upper surface of the second fin, and
wherein the first depth is deeper than the third depth.

11. The semiconductor device of claim 10,
wherein the first recess comprises a first width that is coplanar with the upper surface of the first fin,
wherein the second recess comprises a second width that is coplanar with the upper surface of the second fin, and
wherein the first width is wider than the second width.

12. The semiconductor device of claim 10,
wherein an upper surface of the first isolation layer is coplanar with, or extends beyond, the upper surface of the first fin,
wherein an upper surface of the second isolation layer is coplanar with, or extends beyond, the upper surface of the second fin, and
wherein a first cross-sectional area of the first isolation layer in the first recess is larger than a second cross-sectional area of the second isolation layer in the second recess.

13. The semiconductor device of claim 12, wherein the first isolation layer and the second isolation layer comprise different respective lattice structures.

14. A semiconductor device comprising:
first and second metal-oxide-semiconductor (MOS) device regions comprising opposite MOS device types, respectively,
the first MOS device region comprising:
a first semiconductor fin;
first and second gate structures on first and second portions of the first semiconductor fin;
a first insulating material in a third portion of the first semiconductor fin that is between the first and second portions of the first semiconductor fin;
a first spacer adjacent one edge of an upper portion of the first insulating material; and
a second spacer immediately adjacent the first spacer, wherein the first insulating material is between the first and second spacers, and
the second MOS device region comprising:
a second semiconductor fin;
third and fourth gate structures on first and second portions of the second semiconductor fin; and
a second insulating material in a third portion of the second semiconductor fin that is between the first and second portions of the second semiconductor fin;
a third spacer adjacent one edge of an upper portion of the second insulating material; and
a fourth spacer immediately adjacent the third spacer, wherein the second insulating material is between the third and fourth spacers, and
wherein a first width between the first and second spacers is wider than a second width between the third and fourth spacers.

15. The semiconductor device of claim 14,
wherein the first insulating material comprises a first depth in the first semiconductor fin that is deeper than a second depth of the second insulating material in the second semiconductor fin.

16. The semiconductor device of claim 15,
wherein the semiconductor device further comprises a source/drain region between the first insulating material and one of the first and second portions of the first semiconductor fin, and
wherein the first depth of the first insulating material is deeper than a third depth of the source/drain region in the first semiconductor fin.

17. The semiconductor device of claim 14, wherein an uppermost surface of the first insulating material is coplanar with, or protrudes beyond, an uppermost surface of the first semiconductor fin.

18. The semiconductor device of claim 14, wherein a cross-sectional area of the first insulating material in the first semiconductor fin is larger than a cross-sectional area of the second insulating material in the second semiconductor fin.

* * * * *